(12) United States Patent
Yamada et al.

(10) Patent No.: US 9,490,237 B2
(45) Date of Patent: Nov. 8, 2016

(54) SEMICONDUCTOR PACKAGE INCLUDING A PLURALITY OF CHIPS

(71) Applicant: Kabushiki Kaisha Toshiba, Tokyo (JP)

(72) Inventors: Hiroshi Yamada, Kanagawa (JP); Yutaka Onozuka, Kanagawa (JP); Atsuko Iida, Kanagawa (JP); Kazuhiko Itaya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/593,773

(22) Filed: Jan. 9, 2015

(65) Prior Publication Data

US 2015/0123275 A1 May 7, 2015

Related U.S. Application Data

(62) Division of application No. 13/766,195, filed on Feb. 13, 2013, now Pat. No. 8,980,697.

(30) Foreign Application Priority Data

Mar. 8, 2012 (JP) .................................. 2012-051318
Mar. 29, 2012 (JP) .................................. 2012-075803

(51) Int. Cl.
*H01L 25/10* (2006.01)
*H01L 21/78* (2006.01)
(Continued)

(52) U.S. Cl.
CPC ............. *H01L 25/105* (2013.01); *H01L 21/56* (2013.01); *H01L 21/561* (2013.01); *H01L 21/563* (2013.01); *H01L 21/76802* (2013.01); *H01L 21/78* (2013.01); *H01L 23/3114* (2013.01); *H01L 23/3135* (2013.01); *H01L 23/481* (2013.01); *H01L 23/495* (2013.01); *H01L 23/49572* (2013.01); *H01L 23/49838* (2013.01); *H01L 24/14* (2013.01); *H01L 24/24* (2013.01);
(Continued)

(58) Field of Classification Search
CPC ... H01L 24/20; H01L 24/82; H01L 25/0655; H01L 23/3135; H01L 23/528; H01L 23/481; H01L 23/3114; H01L 21/76802; H01L 23/5226; H01L 23/49838
See application file for complete search history.

(56) References Cited

U.S. PATENT DOCUMENTS 6,271,469 B1 *  8/2001  Ma ........................... H01L 21/56
                                                                174/521
6,873,060 B2 *  3/2005  Blaszczak et al. ............ 257/787

(Continued)

FOREIGN PATENT DOCUMENTS

| JP | 2001-85606 | 3/2001 |
|---|---|---|
| JP | 2007-260866 | 10/2007 |
| JP | 2009-194113 | 8/2009 |

OTHER PUBLICATIONS

Office Action issued on Jun. 24, 2014, in Japanese Patent Application No. 2012-075803 with English translation.

(Continued)

*Primary Examiner* — Alonzo Chambliss
(74) *Attorney, Agent, or Firm* — Oblon, McClelland, Maier & Neustadt, L.L.P

(57) ABSTRACT

A reconfigured wafer of resin-encapsulated semiconductor packages is obtained by supporting with a resin, thereafter, a grinding process is performed on top and backside surfaces to expose only a bump interconnection electrode on a surface of a semiconductor chip. Further, a chip-scale package is obtained by a dicing process along a periphery of the chip.

5 Claims, 27 Drawing Sheets

(51) Int. Cl.
  *H01L 23/495* (2006.01)
  *H01L 21/56* (2006.01)
  *H01L 23/31* (2006.01)
  *H01L 21/768* (2006.01)
  *H01L 23/498* (2006.01)
  *H01L 23/48* (2006.01)
  *H01L 25/16* (2006.01)
  *H01L 25/00* (2006.01)
  *H01L 23/00* (2006.01)
  *H01L 23/522* (2006.01)

(52) U.S. Cl.
  CPC ............... *H01L 24/96* (2013.01); *H01L 24/97* (2013.01); *H01L 25/16* (2013.01); *H01L 25/50* (2013.01); *H01L 23/5226* (2013.01); *H01L 24/82* (2013.01); *H01L 2224/12105* (2013.01); *H01L 2224/13023* (2013.01); *H01L 2224/13024* (2013.01); *H01L 2224/24137* (2013.01); *H01L 2224/24195* (2013.01); *H01L 2224/48091* (2013.01); *H01L 2224/48247* (2013.01); *H01L 2224/48465* (2013.01); *H01L 2224/49171* (2013.01); *H01L 2224/73267* (2013.01); *H01L 2224/97* (2013.01); *H01L 2225/1035* (2013.01); *H01L 2225/1064* (2013.01); *H01L 2924/181* (2013.01)

(56) References Cited

U.S. PATENT DOCUMENTS

| | | | |
|---|---|---|---|
| 7,514,769 B1 | 4/2009 | Mostafazadeh | |
| 7,514,786 B2 * | 4/2009 | Hsu | H01L 24/19 257/737 |
| 7,629,199 B2 * | 12/2009 | Huang et al. | 438/105 |
| 7,741,151 B2 * | 6/2010 | Amrine et al. | H01L 21/568 257/E21.499 |
| 7,750,467 B2 * | 7/2010 | Pu et al. | 257/737 |
| 7,875,481 B2 | 1/2011 | Onozuka et al. | |
| 7,906,823 B2 | 3/2011 | Suzuki et al. | |
| 8,008,760 B2 | 8/2011 | Yamada et al. | |
| 8,193,647 B2 | 6/2012 | Hsieh et al. | |
| 8,754,514 B2 * | 6/2014 | Yu | H01L 23/49816 257/686 |
| 8,980,697 B2 * | 3/2015 | Yamada et al. | 438/113 |
| 2003/0092252 A1 | 5/2003 | Nishiyama et al. | |
| 2004/0203187 A1 | 10/2004 | Sekiya et al. | |
| 2005/0116337 A1 * | 6/2005 | Chua et al. | 257/723 |
| 2007/0273018 A1 | 11/2007 | Onozuka et al. | |
| 2008/0318356 A1 | 12/2008 | Onozuka et al. | |
| 2009/0206444 A1 | 8/2009 | Yamada et al. | |
| 2011/0057305 A1 * | 3/2011 | Chia | H01L 23/3171 257/700 |
| 2011/0127654 A1 | 6/2011 | Weng et al. | |
| 2013/0037935 A1 | 2/2013 | Xue et al. | |
| 2013/0130443 A1 | 5/2013 | Lu et al. | |
| 2013/0342998 A1 | 12/2013 | Chen | |

OTHER PUBLICATIONS

Office Action issued Nov. 25, 2014 in Japanese Patent Application No. 2012-075803 (with English translation).

* cited by examiner

PRIOR ART

PRIOR ART

PRIOR ART

BURRING・PEELING

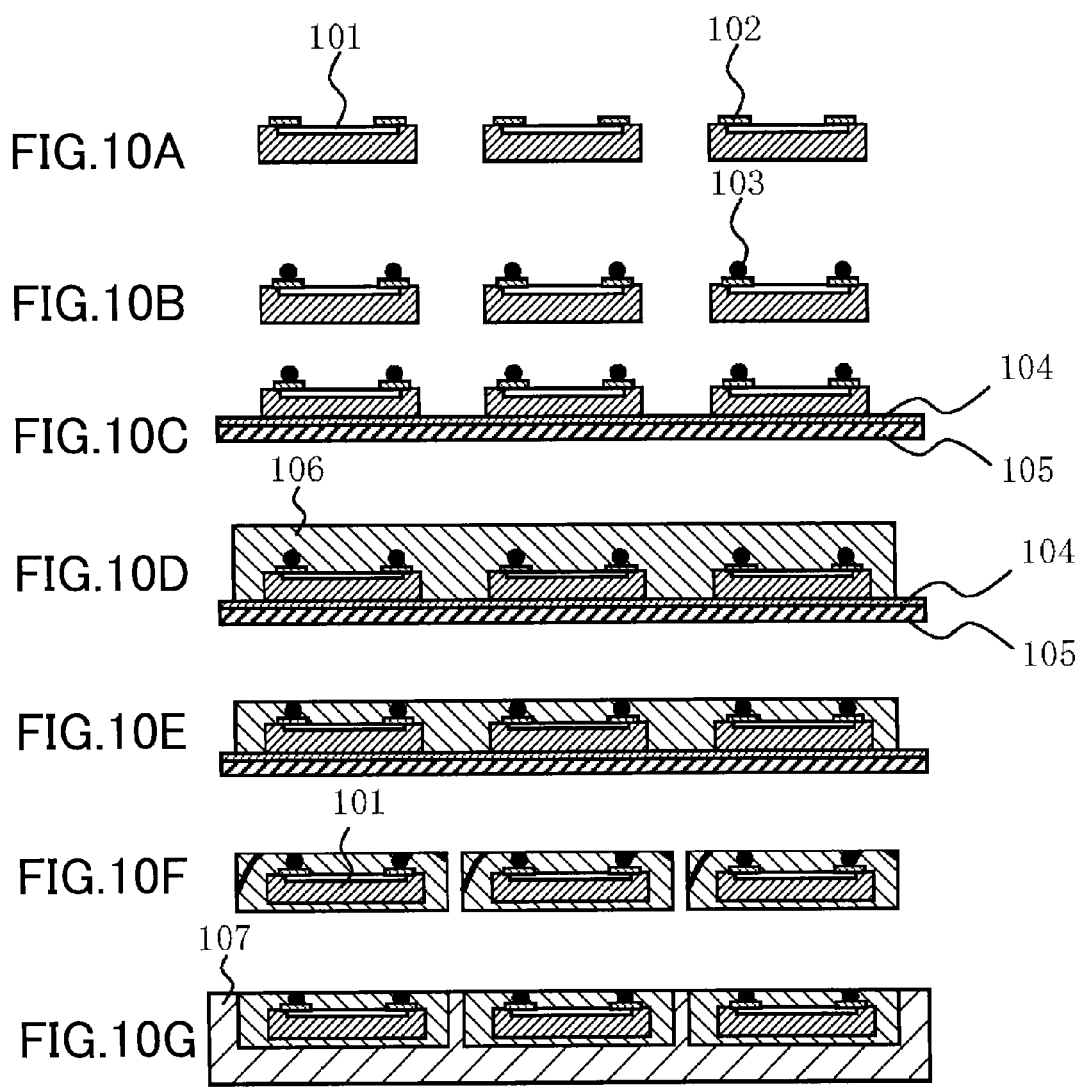

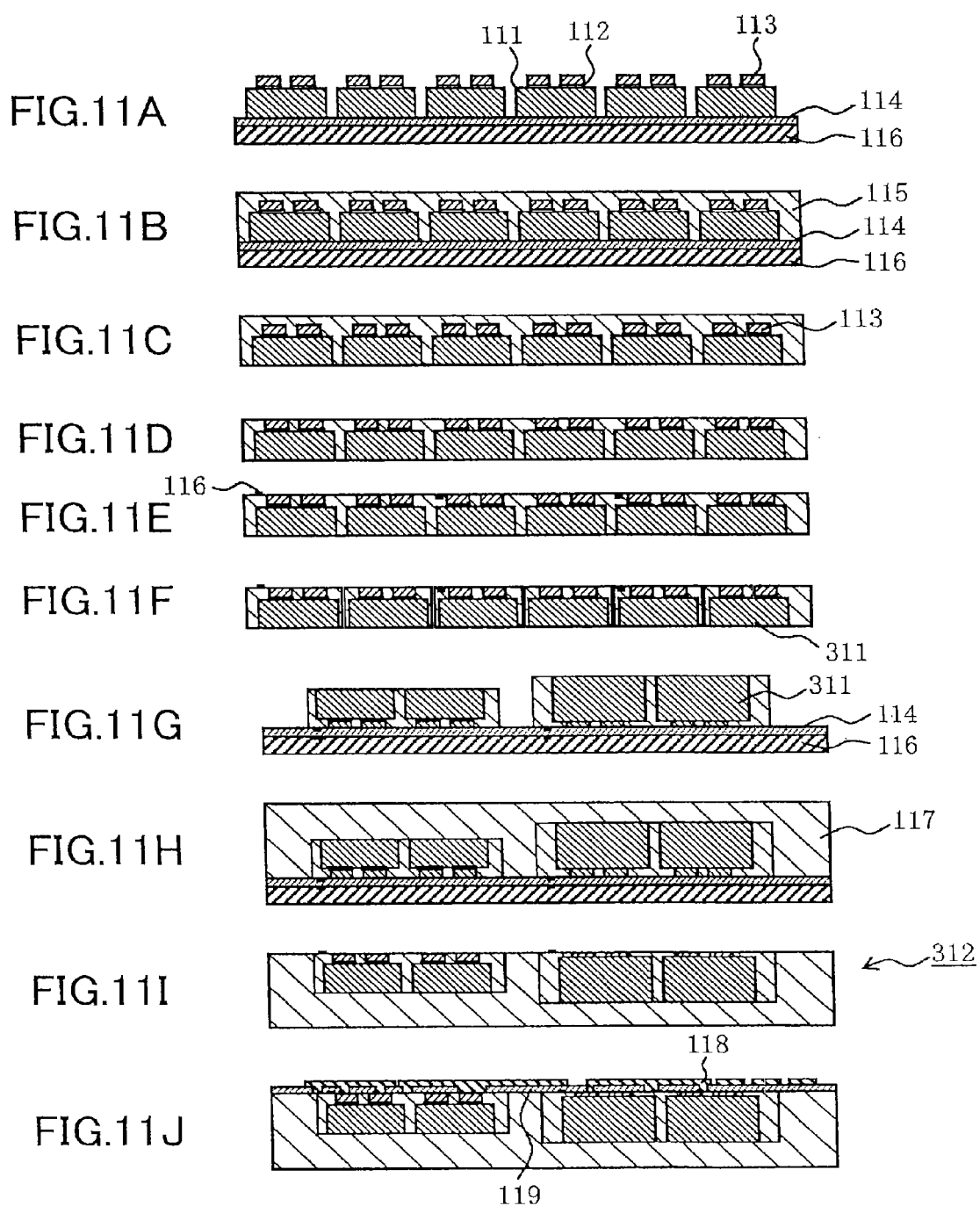

t represents thickness of reconfigured wafer

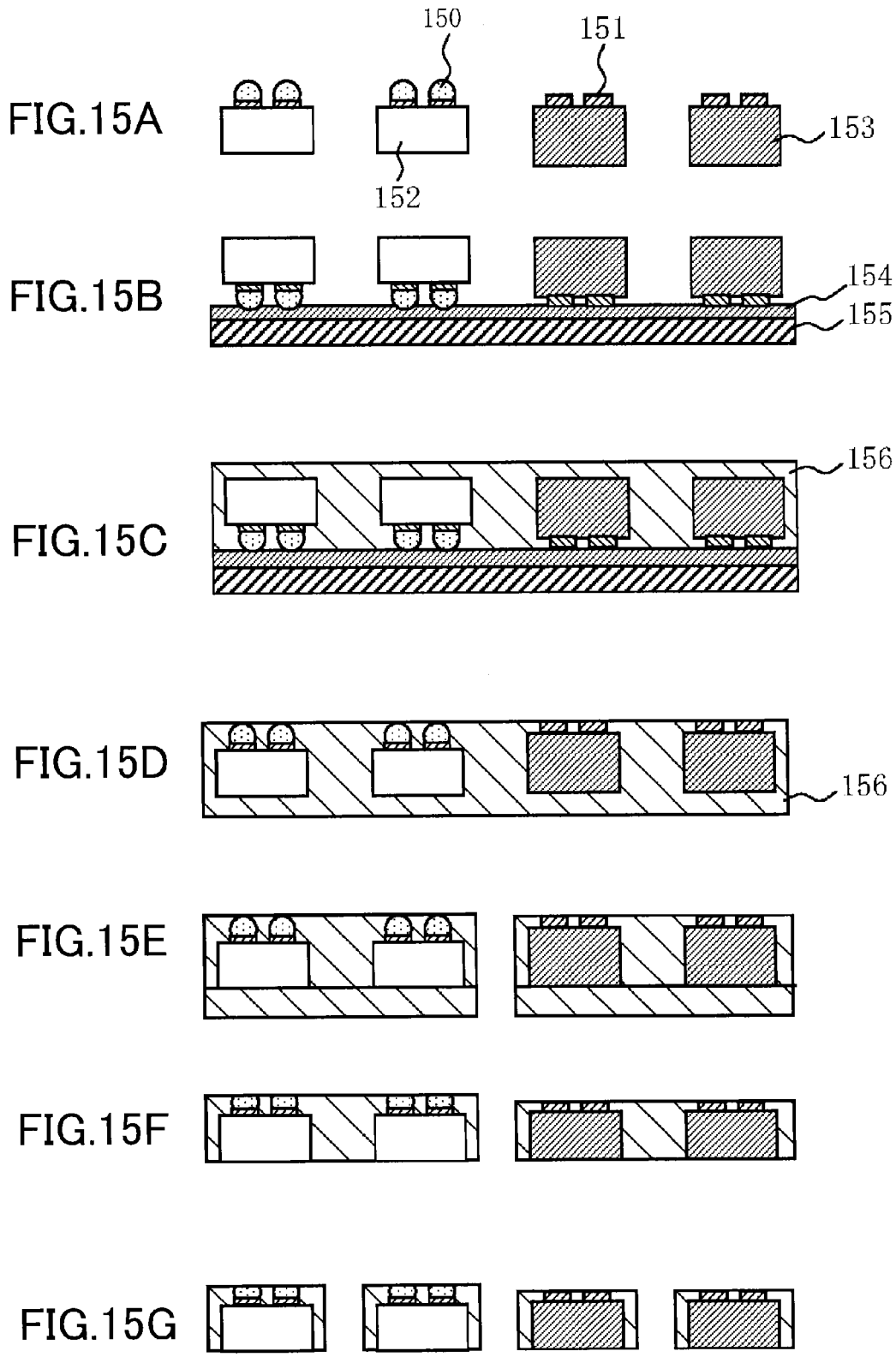

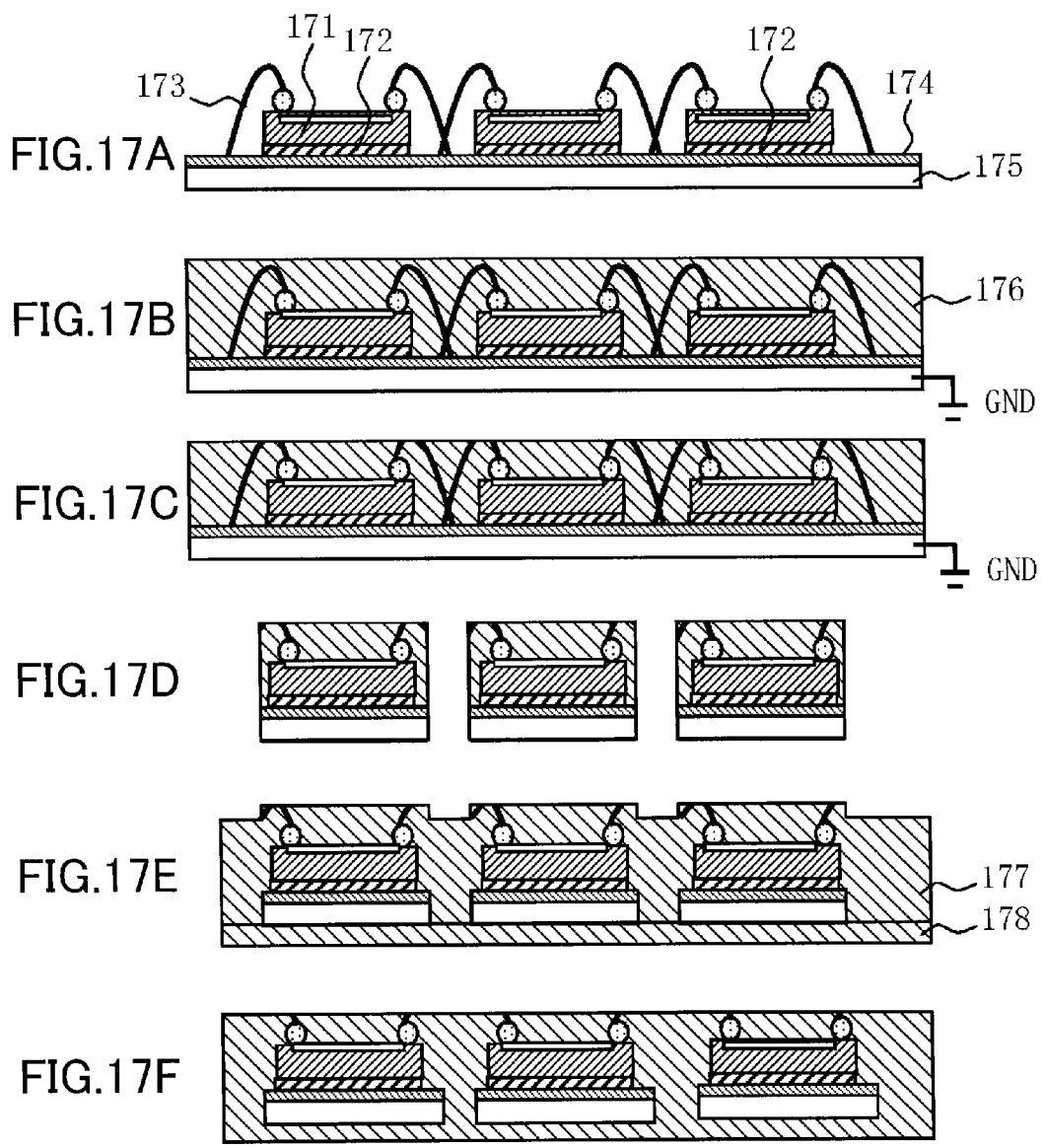

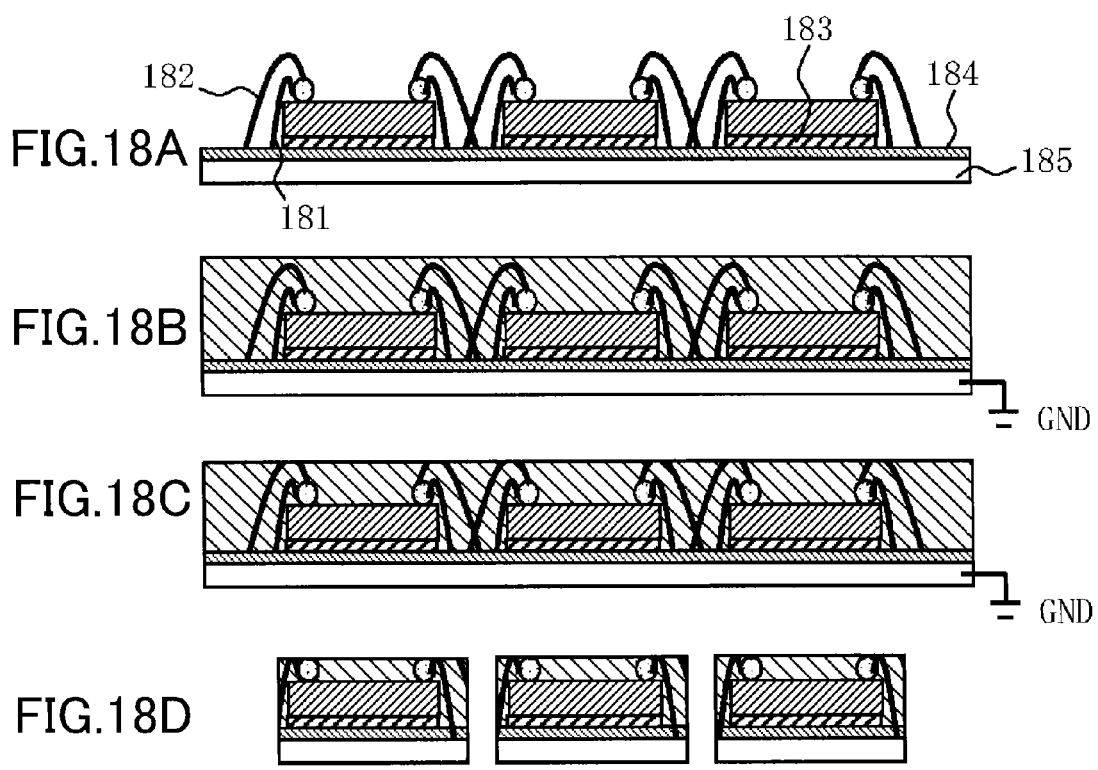

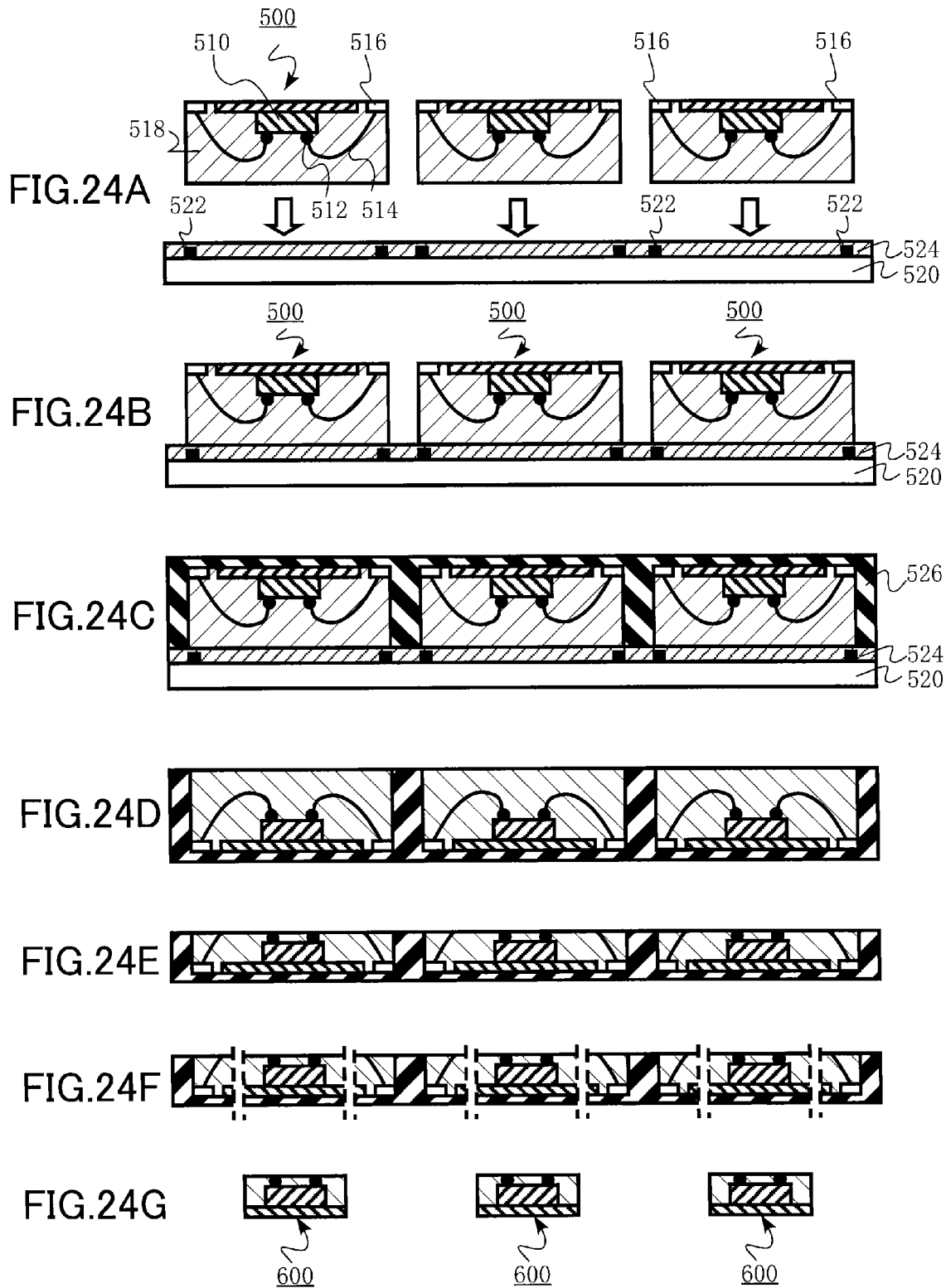

SEMICONDUCTOR PACKAGE INCLUDING A PLURALITY OF CHIPS

CROSS-REFERENCE TO RELATED APPLICATION

The present divisional application claims the benefit of priority under 35 U.S.C. 120 to application Ser. No. 13/766,195, filed on Feb. 13, 2013 and claims the benefit of priority under 35 U.S.C. 119 from Japanese Patent Application No. 2012-051318, filed on Mar. 8, 2012, and Japanese Patent Application No. 2012-075803, filed on Mar. 29, 2012, the entire contents of which are incorporated herein by reference.

FIELD

Embodiments described herein relate generally to a method of manufacturing a semiconductor device, a semiconductor integrated device, and a method of manufacturing the same.

BACKGROUND

Recently, large-scale-integration technology of semiconductor devices progress and high-density semiconductor chip packaging technology is required. For example, in a ubiquitous society, small size electronic devices having wireless communication as represented by handheld terminals such as a portable phone and a PDA are increased in the market, so that smaller and lighter electronic devices are required. From now on, requirements for multifunction and high performance electronics devices will be further increased in order to meet various requirements. Although the packaging interconnection technology of the semiconductor chip typically includes wire bonding technology, flip chip bonding technology, which realizes highest density, is often used as the high-density interconnection technology.

A semiconductor package, in which the semiconductor chip is packaged, has been studied and developed for a peripheral package such as a TSOP (thin small-outline package) and a QFP (quad flat package). And, a semiconductor package is developed for an area array package such as a BGA (ball grid array) and a CSP (chip-scale package), which supports a number of I/O pins. Particularly, in the case of chip-scale package (hereinafter, referred to as "CSP" or "chip-scale package" in this specification), chip size package with encapsulation resin is performed in order to realize easy bare chip handling. Specifically, this is obtained by encapsulating an entire surface of the semiconductor chip with a resin such that a bump electrode is exposed. The CSP is a resin-encapsulated semiconductor package in the chip size, so that this may easily realize the high-density electronic devices.

Together with the CSP, an MCP (multi-chip package) and an SiP (system in package) in which a plurality of semiconductor chips are packaged become mainstream of semiconductor package technology. In the MCP and the SiP, a plurality of bare chip is usually packaged. However, there is a case in which the bare chip cannot be easily obtained from a market as a product. In such a case, a semiconductor package itself in which the bare chip is resin-encapsulated is packaged in the MCP and the SiP instead of the bare chip. In this case, there is a problem that a size of the MCP or the SiP becomes large due to the large size of the semiconductor package.

In a wireless communication device, in general, not only one type of semiconductor device but also different types of semiconductor devices including a passive component should be packaged together. However, it is difficult to manufacture different types of semiconductor devices on one semiconductor chip (system LSI) due to difference in manufacturing processes of each device. And there is a problem that integration density cannot be made high enough by the MCP or the SiP on a printed circuit board. Therefore, advanced packaging technology to integrate not only one type of semiconductor device but also different types of semiconductor devices including the passive component into one chip is required.

BRIEF DESCRIPTION OF THE DRAWINGS

FIGS. 10A to 10G are cross-sectional views of steps of manufacturing a semiconductor integrated device according to a second example;

FIGS. 11A to 11J are step cross-sectional views for illustrating a third example;

FIGS. 15A to 15G are step cross-sectional views for illustrating a fifth example;

FIGS. 17A to 17F are step cross-sectional views for illustrating a sixth example;

FIGS. 18A to 18D are step cross-sectional views for illustrating the sixth example;

FIGS. 24A to 24G are step cross-sectional views illustrating a method of manufacturing a semiconductor device of a third embodiment;

DETAILED DESCRIPTION

Figure 1A:
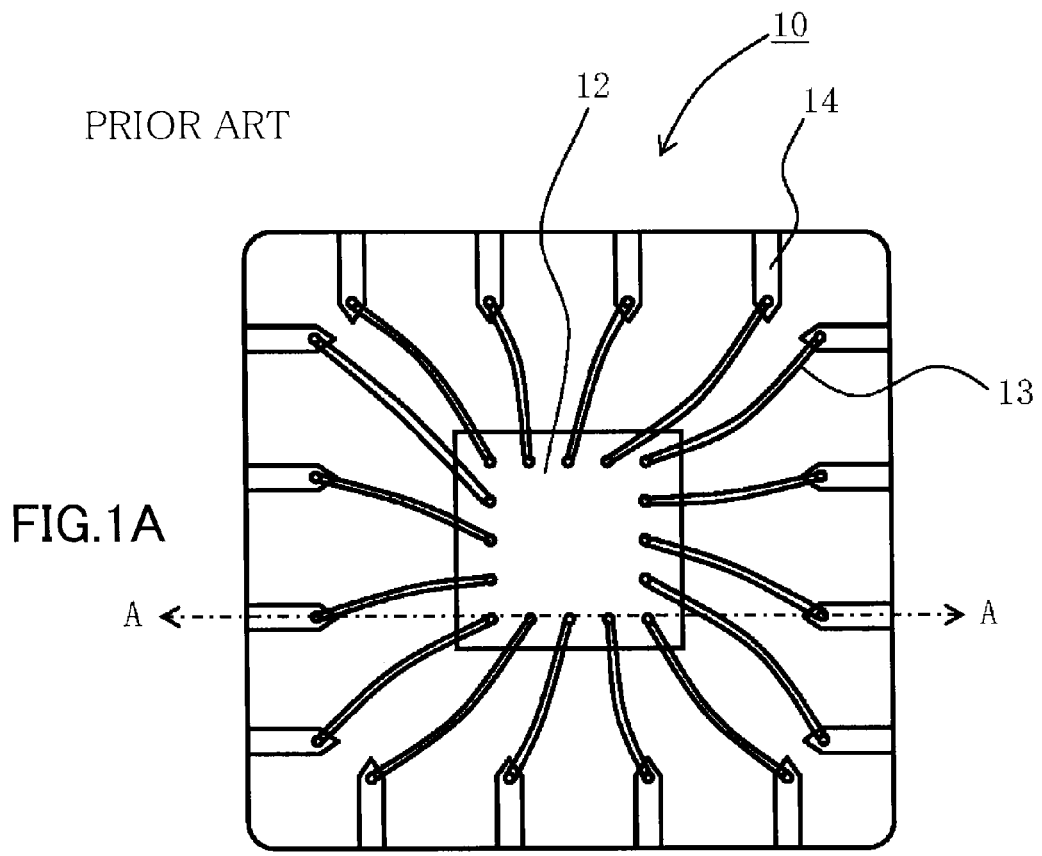
FIGS. 1A and 1B are schematic diagrams for illustrating a conventional semiconductor package.

A method of manufacturing a semiconductor device according to a first embodiment includes forming a semiconductor package integrated body by arranging a plurality of resin-encapsulated semiconductor packages, and supporting the semiconductor packages to each other with a resin. Each of the semiconductor packages including a semiconductor chip, an I/O electrode formed on the semiconductor chip, a ball electrode formed on the I/O electrode, and a bonding wire interconnected to the ball electrode. The semiconductor packages are arranged on a surface of a substrate such that the I/O electrodes of the semiconductor package come on an upper side. The method includes exposing the ball electrode on a surface of the semiconductor chip with an encapsulating resin of the semiconductor package left so as to coat the surface of the semiconductor chip by performing a grinding process on at least a surface on a side of the I/O terminal of the semiconductor package integrated body. And the method includes dividing the semiconductor package integrated body by a cutting (or dicing) process along a side surface of the semiconductor chip to obtain separate semiconductor chips.

A semiconductor integrated device according to a second embodiment at least includes a plurality of electronic components, each of which including an I/O electrode; a ball electrode formed on the I/O electrode of each of the electronic components; a first insulating portion arranged on side surfaces of the electronic component and the ball electrode and a backside surface of the electronic component; a second insulating portion formed on the first insulating portion and the ball electrode and including a via on the ball electrode; and a redistribution layer formed on the second insulating portion and interconnected to the ball electrode, wherein upper surfaces of the ball electrode and the first insulating portion are located on a substantially identical plane.

Further, a method of manufacturing a semiconductor integrated device according to a third embodiment at least includes: forming a ball electrode on an I/O electrode of each of a plurality of electronic components; mounting the plurality of electronic components on a adhesion layer formed on a substrate such that the ball electrode is arranged on an upper side; forming a resin layer on the plurality of electronic components and the adhesion layer; mechanically grinding the resin layer to expose a part of the ball electrode; removing the adhesion layer and the substrate; forming resin blocks by dicing the resin layer between the plurality of electronic components; and integrating the plurality of resin blocks to each other.

In a case in which an MCP and an SiP are formed by a plurality of semiconductor chips, a bare chip is mounted in most cases; however, there is a case in which the bare chip itself cannot be easily obtained from a market when a commercially-available semiconductor device is used. In such a case, instead of a bare chip, the semiconductor package in which the bare chip is encapsulated is packaged in the MCP and the SiP, and there is a problem that a size of the MCP and SiP cannot be made small.

There is a packaging technology in which different types of semiconductor devices and their peripheral circuit components are integrated in one chip by embedding the devices and the components into an epoxy resin. In the technology, the devices and the components are arranged on a wafer (supporting substrate) and reconfigured as a wafer shape. After arranged on the wafer, the devices and the components are encapsulated with an epoxy resin to fix or support each other before dicing into one chip. In the step of encapsulation, because each of the devices and the components has different exterior shape, they may be removed from a supporting substrate, or they may be embedded into the epoxy resin, or asperity may be generated on a surface of a reconfigured wafer. And they may cause interconnection problem of redistribution layer, which electrically interconnects the semiconductor devices and the components.

Hereinafter, in the embodiments, a word "electronic component" intend to mean either a semiconductor package, a semiconductor chip, and a passive component. Also, "semiconductor chip" is intended to mean a chip of a semiconductor formed by dicing a wafer formed of silicon and the like on a surface of which an integrated circuit is formed. This is also referred to as a bare chip. And "semiconductor package" is intended to mean a semiconductor device in which semiconductor chip or chips are encapsulated with the resin. A semiconductor package includes an LSI package, an IC package and the like.

In this specification, the "I/O electrode" is intended to mean an output/input electrode provided on the semiconductor chip. The I/O electrode is formed during a semiconductor chip forming process and is a pad electrode formed of aluminum, aluminum alloy, titanium, titanium alloy and the like, for example.

In this specification, a "interconnection electrode unit" is intended to mean a metal electrode provided on the I/O electrode for allowing the I/O electrode (pad electrode) of the semiconductor chip and an electrode terminal outside the semiconductor chip and the like to electrically interconnect with each other. For example, a bump electrode, a ball unit (may also called ball electrode) formed on the pad electrode when forming the bonding wire, and the electrode such as a thick metal layer, a ball electrode, columnar metal and the like formed by an additive process are included. When the bonding wire is used, the bonding wire just above the ball unit (ball electrode) on the pad electrode is also included in the "interconnection electrode unit".

First Embodiment

Figure 1B:
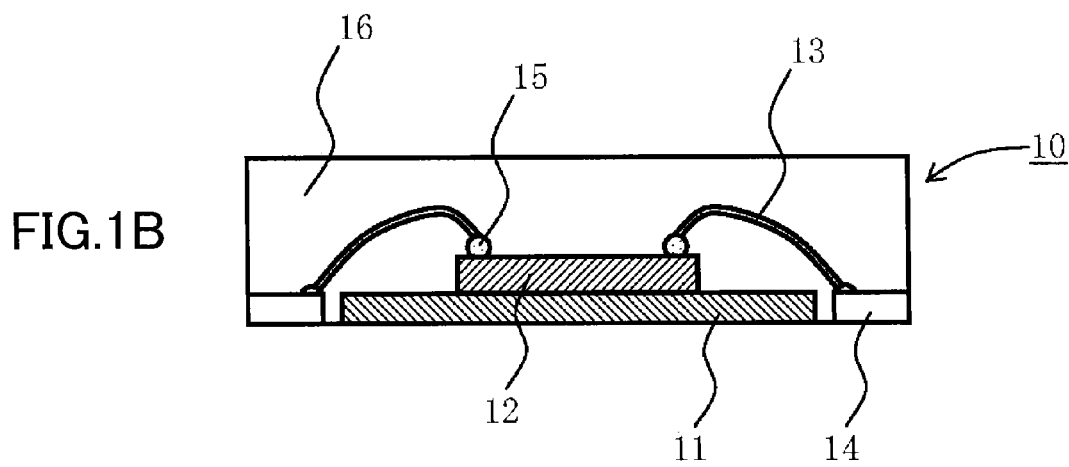

A first embodiment is hereinafter described with reference to FIGS. 1A, 1B, 2A, 2B, 3, and 4A to 4D. FIGS. 1A and 1B are schematic diagrams illustrating an example of a conventional semiconductor package. FIG. 1A is a partially cut-away plane view of the semiconductor package without an encapsulating resin (molding resin), and FIG. 1B is a cross-sectional view of the semiconductor package. As illustrated in FIG. 1B, a semiconductor package 10 is at least provided with a semiconductor chip 12 mounted on a metal substrate 11, a ball electrode 15 electrically interconnected to an I/O electrode of the semiconductor chip 12, a lead frame 14, a bonding wire 13 formed of Au and the like for electrically interconnecting the ball electrode 15 to the lead frame 14, and a encapsulating resin (molding resin) 16 for encapsulating them.

This embodiment relates to a manufacturing method of trimming the resin-encapsulated semiconductor package to convert to a chip-scale package (CSP).

Figure 2A:
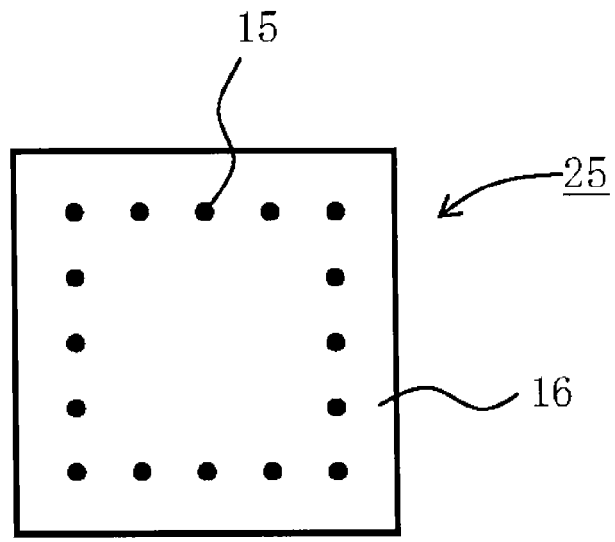
FIGS. 2A and 2B are schematic diagrams for illustrating a chip-scale package of a first embodiment.
Figure 2B:
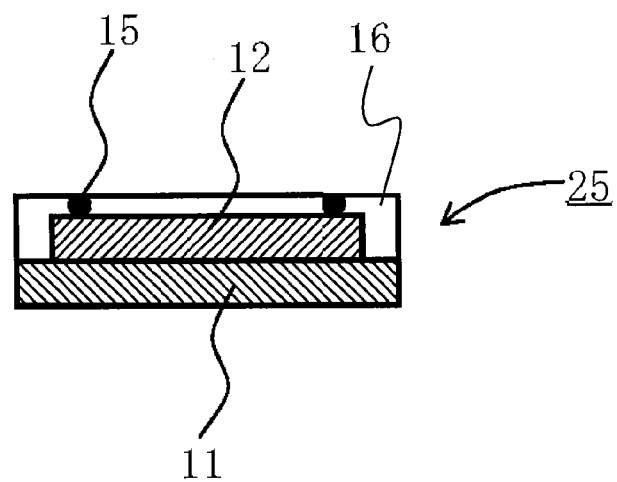

FIGS. 2A and 2B are views illustrating an example of the CSP manufactured by this embodiment. FIG. 2A is a plane view and FIG. 2B is a cross-sectional view. As illustrated in FIG. 2A, surface of CSP 25 is coated with the encapsulating resin 16. And the ball electrode 15 is exposed at the surface of CSP 25. As illustrated in FIG. 2B, the semiconductor chip 12 is fixed on the substrate 11 with a conductive bonding paste and the like not illustrated. The ball electrode 15 is electrically interconnected to the I/O electrode of the semiconductor chip 12 and the encapsulating resin 16 coats the semiconductor chip 12. The ball electrode 15 is exposed at the surface of the encapsulating resin 16. A part of the bonding wire 13 formed of gold and the like may be extended to the ball electrode 15.

Hereinafter, the method of manufacturing a semiconductor device according to this embodiment is described more specifically with reference to FIGS. 3, 4A to 4D, and 5, which are cross-sectional views of a semiconductor package illustrating process steps.

Figure 3:
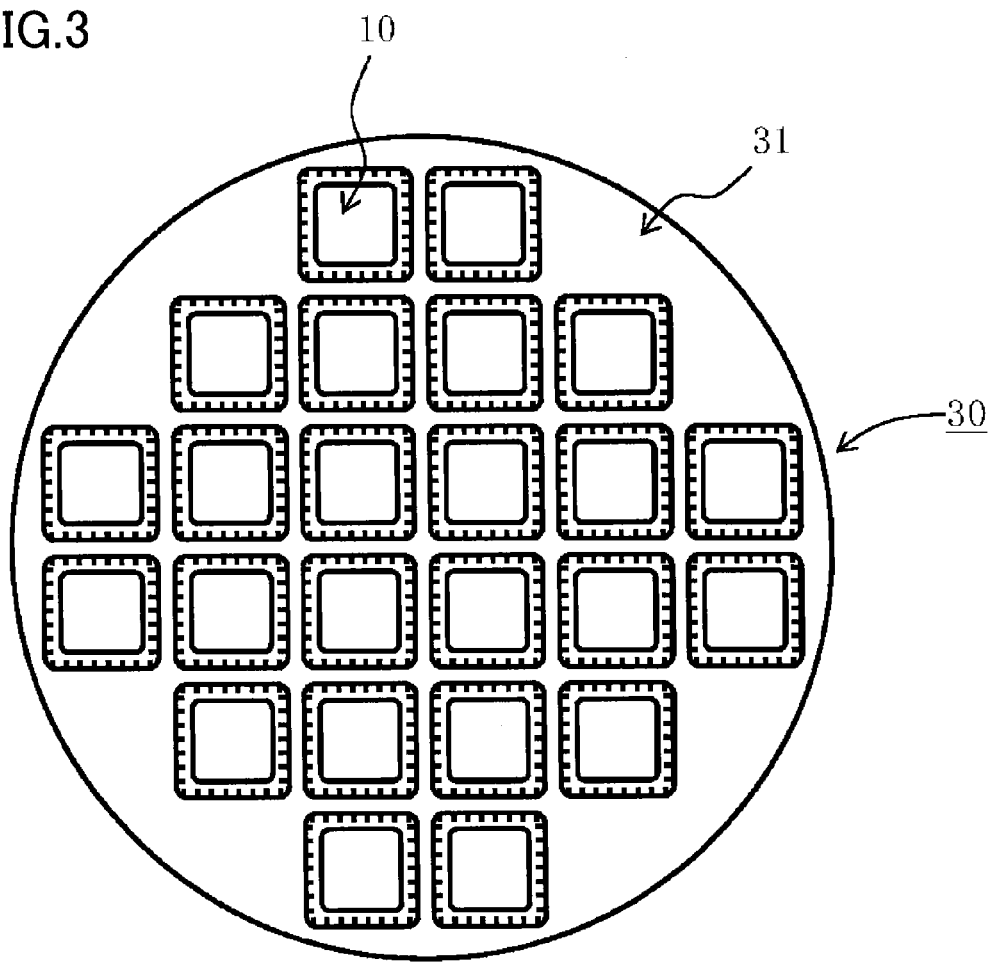
FIG. 3 is a plane view illustrating a semiconductor package integrated body used in the first embodiment.

First, as illustrated in FIG. 3, a semiconductor package integrated body (reconfigured wafer) 30 is prepared. This is obtained by arranging and mounting a plurality of semiconductor packages 10 on a surface of a wafer substrate 31 with the bonding paste or an adhesive. The wafer substrate 31 supports the semiconductor package. Next, the semiconductor packages 10 are fixed to each other on the surface with an encapsulating resin 32 such that sufficient strength for a machining process is provided.

Next, the chip-scale package (CSP) 25 is manufactured from the integrated body 30 at steps illustrated in FIGS. 4A to 4D. FIGS. 4A to 4D are cross-sectional views illustrating manufacturing steps, and in the drawings, a part of the semiconductor package integrated body 30 is cut away and illustrated.

Figure 4A:
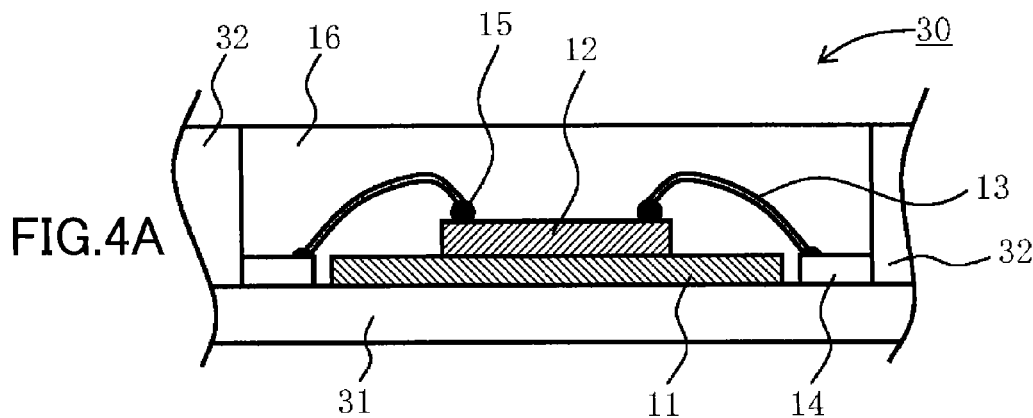
FIGS. 4A to 4D are schematic cross-sectional views for illustrating a manufacturing process of the first embodiment.

As illustrated in FIG. 4A, in the semiconductor package integrated body 30, a plurality of semiconductor packages 10 are mounted on the surface of the wafer substrate 31 and the semiconductor packages are embedded in a encapsulating resin 32. In this embodiment, preferably, the encapsulating resin 32 supporting the semiconductor packages 10 to each other and a resin 16 of the semiconductor packages 10 are formed of resin materials including identical major components. And, more preferably, a material equivalent to that of the encapsulating resin (molding resin) 16 of the semiconductor package 10 is used for the encapsulating resin 32.

Figure 4B:
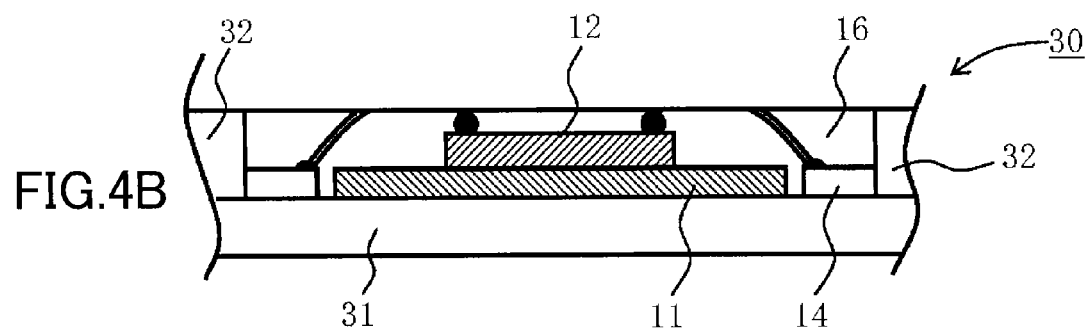

Next, mechanical grinding and mechanical polishing are performed on the semiconductor package integrated body 30 from a side on which the ball electrode 15 is formed to remove the encapsulating resin 16 on the semiconductor package 10. This step is performed until a ball electrode unit 15 formed of the ball electrode 15 or the bonding wire 13 is exposed (FIG. 4B).

Figure 5:
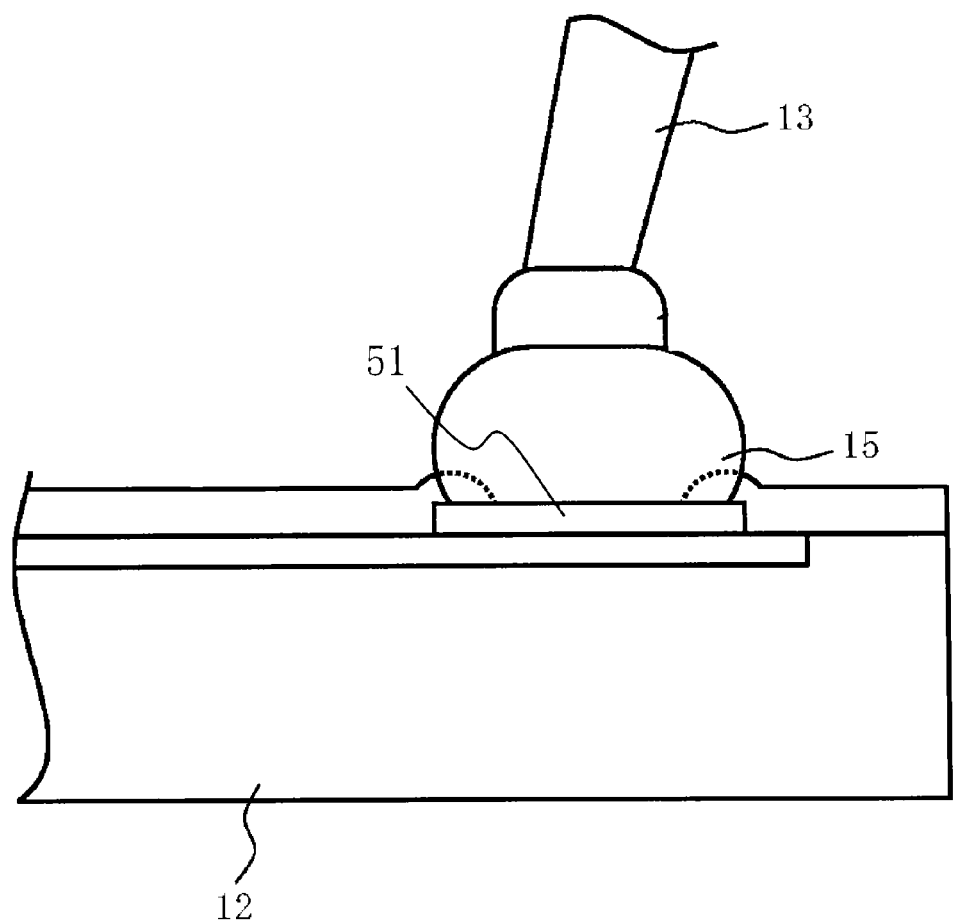
FIG. 5 is a side view illustrating a bonding of an I/O electrode and a bonding wire of the first embodiment.

FIG. 5 illustrates an I/O electrode 51 of the semiconductor chip 12, the ball electrode 15, and the bonding wire 13. As illustrated in FIG. 5, this interconnecting portion is configured to electrically/mechanically interconnect the ball electrode 15 formed of gold and the like to a surface of the I/O electrode unit 51 of the semiconductor chip formed of aluminum alloy and the like and the bonding wire 13 formed of gold and the like is formed on the ball electrode 15. At the above-described mechanical grinding/mechanical polishing step, it is preferable to grind and polish down to the interconnecting portion of the bonding wire 13 and the ball electrode 15. An object of this is to minimize a positional error of a gold ball exposed on the surface. Positional error of bonding wire in the semiconductor package is larger than that of the ball electrode 15 formed directly above the I/O electrode. Therefore, by grind and polish down to the interconnecting portion of the bonding wire 13 and the ball electrode 15 positional error of exposing gold can be minimized. Some bonding wire may be left on the ball electrode 15 as long as this is on the I/O electrode.

At this step, a mechanical grinding/mechanical polishing process may be performed by dry or wet buff treatment. Furthermore, it is possible to perform the mechanical grinding and the mechanical polishing of the encapsulating resin formed on a backside surface of the substrate 11 in a similar method as needed.

Figure 4C:
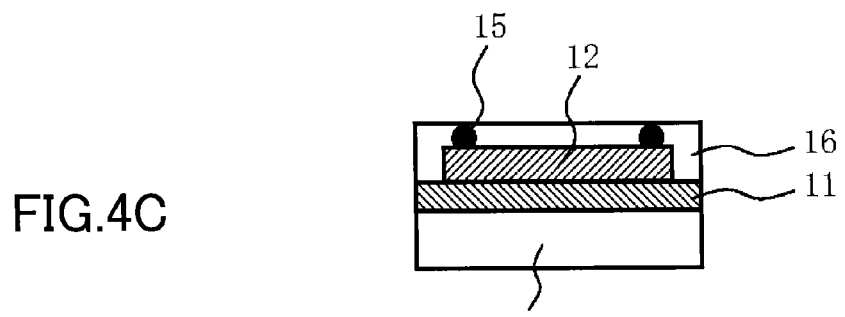
Figure 4D:
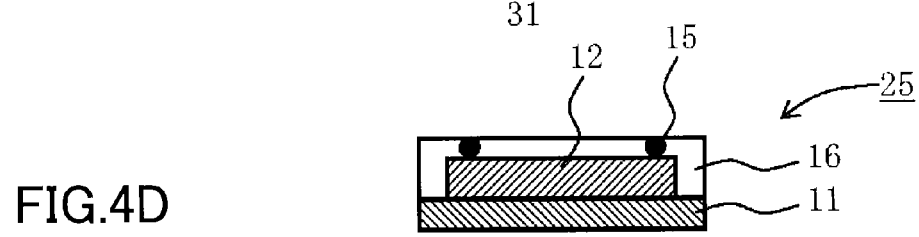

Next, a dicing (cutting) process is performed on the encapsulating resin 16, the substrate 11, and the wafer substrate 31 below the semiconductor chip 12 by dicing as illustrated in FIG. 4C. A dicing position at that time is preferably closer to a side surface of the semiconductor chip 12 as long as a side surface of the chip-scale package (CSP) 12 is remain coated with the encapsulating resin 16.

Next, the chip-scale package (CSP) 25 is manufactured by removing the wafer 31 fixed to a backside surface of the divided semiconductor package.

It is possible to efficiently manufacture the chip-scale package (CSP) with excellent reproducibility by the above-described method.

First Example

A method of manufacturing a CSP according to the first embodiment is described in more detail by a following example. Although the CSP having a size of 4.3 mm×3.2 mm is manufactured by grinding an RF-IC having a semiconductor package size of 8 mm×8 mm×0.8 mm in which a semiconductor chip having a chip size of 4.1 mm×3.0 mm×0.45 mm is packaged for description in this example, the method of manufacturing a semiconductor device according to this embodiment is not limited to the above-described semiconductor package and is not especially limited unless the spirit thereof is not different.

First, a reconfigured wafer as illustrated in FIG. 3 is formed by distributing a plurality of resin-encapsulated (resin-molded) semiconductor packages. An object of this is to increase a manufacturing quantity by arranging a plurality of semiconductor packages and to improve manufacturing stability by arranging a plurality of semiconductor packages.

A resin for interconnecting the semiconductor packages to each other is not especially limited: an epoxy resin of which major component is the same as that of the resin-encapsulated package is used as a encapsulating resin. Specifically, in this embodiment, epoxy resin melt obtained by crushing, mixing and melting 100 parts by weight of epoxy cresol novorac resin (ECON-195XL; manufactured by Sumitomo Chemical Co., Ltd), 54 parts by weight of phenol resin as a curing agent, 100 parts by weight of fused silica as filler, 0.5 part by weight of benzyldimethylamine as a catalyst, and 3 parts by weight of carbon black and 3 parts by weight of silane coupling agent as other additives is used for description.

Thereafter, the epoxy resin as a encapsulating material is heated to be cured at 120 degrees centigrade for 60 minutes, thereby reconfiguring a semiconductor package integrated body 30 having a diameter of 500 mm as illustrated in FIG. 3.

Thereafter, as illustrated in FIG. 4B, mechanical grinding and mechanical polishing are performed until a ball electrode 15 on the semiconductor chip 12 is exposed. Although a performance of mechanical grinding is not especially limited, it is preferable to uniformize such that asperity becomes approximately ±5 μm by the mechanical grinding and thereafter obtain a degree of accuracy with the asperity of approximately ±3 μm or less by the mechanical polishing in order to realize a high degree of accuracy. Specifically, it is preferable to use oxidized cerium having a particle diameter of approximately 5 μm to 10 μm, for example, or approximately #1000 waterproof polishing paper for the mechanical grinding and to use oxidized cerium, oxidized alumina, or diamond having a particle diameter of approximately 0.3 μm for the mechanical polishing. At that time, when a wet polishing method with liquid polishing paste as a polishing slurry is used, the asperity is generated by difference in polishing speed between a metal material and the epoxy resin. Therefore, it is preferable to use a dry polishing method with a disk in which diamond and the like is embedded for finishing micro polishing.

A grinding process is performed such that a height of 50 μm of the ball electrode 15 formed on the semiconductor chip 12 is left and the high degree of accuracy with the asperity of ±1 μm on a surface of the reconfigured wafer is obtained by using the above-described mechanical grinding/mechanical polishing method.

Further, a dicing process is performed on the semiconductor package integrated body 30 using a dicing apparatus by a well-known method. A DAD 520 (manufactured by Disco Corporation) was used as the dicing apparatus. The dicing was performed such that a periphery of the chip was left with a width of 100 μm and the CSP having a size of 4.3 mm×3.2 mm×0.5 mm was realized.

As a result, it became possible to decrease the size of the semiconductor package of 8 mm×8 mm×0.8 mm to 4.3 mm×3.2 mm×0.5 mm and it became possible to decrease a package area to 20% and to decrease a thickness to approximately 62.5%.

According to this embodiment, after the reconfigured wafer of the resin-encapsulated packages is obtained, the grinding process is performed on front and backside surfaces thereof to expose a ball electrode on a surface of the chip. Thereafter, the CSP is obtained by a dicing process along the periphery of the chip, so that the CSP of the semiconductor package, which cannot be easily obtained conventionally, may be obtained, and high-density electronic device may be easily realized.

Hereinafter, a more preferable mode of this embodiment is summarized. The ball electrode formed on an I/O electrode on the surface of the semiconductor chip is not limited to a ball shape and the metal materials having various shapes may also be used. Also, the metal material is preferably formed of metal including at least Ti, Ni, Al, Cu, Au, Ag, Pb, Sn, Pd, and W and alloy thereof. Also, at a step of the dicing process of the periphery of the semiconductor chip, it is preferable to perform the dicing process taking the exposed metal material as an alignment mark. According to this, possibility to break the semiconductor chip may be reduced.

Second Embodiment

This embodiment relates to technology to combine different types of semiconductor devices or passive components to obtain a one chip package.

A conventional method of integrating the different types of semiconductor devices and their peripheral circuit components generally includes following two methods. One of them is referred to as a system on chip (SoC) for integrating a plurality of semiconductor devices and components by directly forming them on one chip. A degree of integration of the semiconductor devices and the components is high in this method. And they are formed on one chip, so that scaling-down of global redistribution layer between the semiconductor devices and the components also becomes possible. However, it is difficult to integrate semiconductor devices on one chip, for example, when forming a semiconductor device made of different crystal material such as GaAs on a Si substrate, due to difference in semiconductor materials, difference in lattice constants, and difference in the coefficient of thermal expansion of the materials. The SoC has a problem of a high cost and a necessity of long development period at the time of new system development.

Another is a method referred to as a system in package (SiP). This is the method of separately forming each semiconductor chip and integrated them on the substrate referred to as an interposer substrate. In this method, each integrated semiconductor chip is separately formed, so that there is no limitation on a semiconductor process to integrate them. At the time of package development, it is possible to use an commercially-available semiconductor chip, so that the development cost may be decreased and the development period may be shortened. However, since the interposer substrate and the semiconductor chips are interconnected by a bonding wire or a bump electrode, there is limitation in scaling-down of the substrate and the wiring. Therefore, SiP has a problem that there may be a limitation in scaling-down.

Figure 6A:
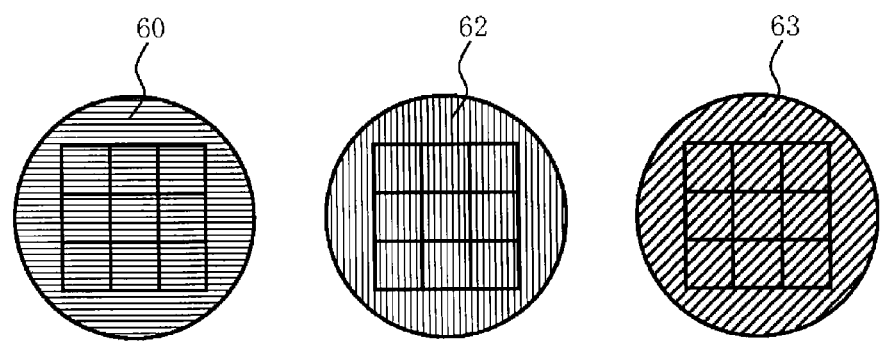
FIGS. 6A to 6C are conceptual diagrams for illustrating a conventional technical problem.
Figure 6B:
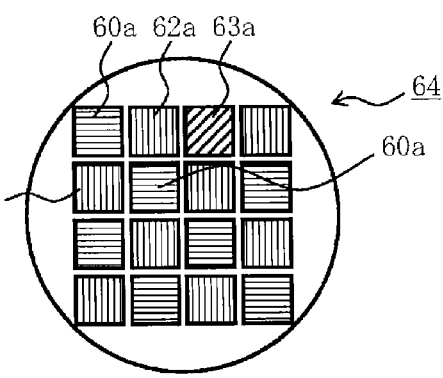
Figure 6C:
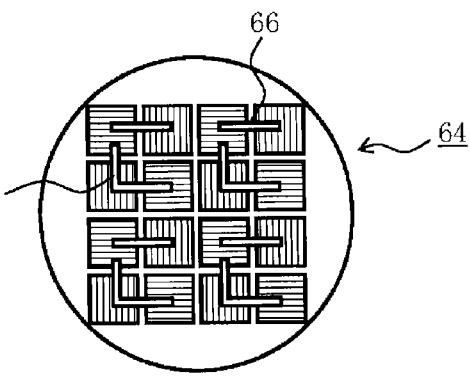

In order to overcome the problems, some new integrating methods are proposed. An example thereof is hereinafter described. As illustrated in FIGS. 6A to 6C, different types of semiconductor chips 60a, 62a, and 63a, each of which is formed by individual manufacturing process on wafers 60, 62 and 63 respectively. Then, the semiconductor chips 60a, 62a, and 63a are electrically tested and selected, and thereafter the chips 60a, 62a, and 63a are arranged on a substrate to form a reconfigured wafer 64. In the drawing, a reference numeral 66 represents redistribution layer.

Figure 7:
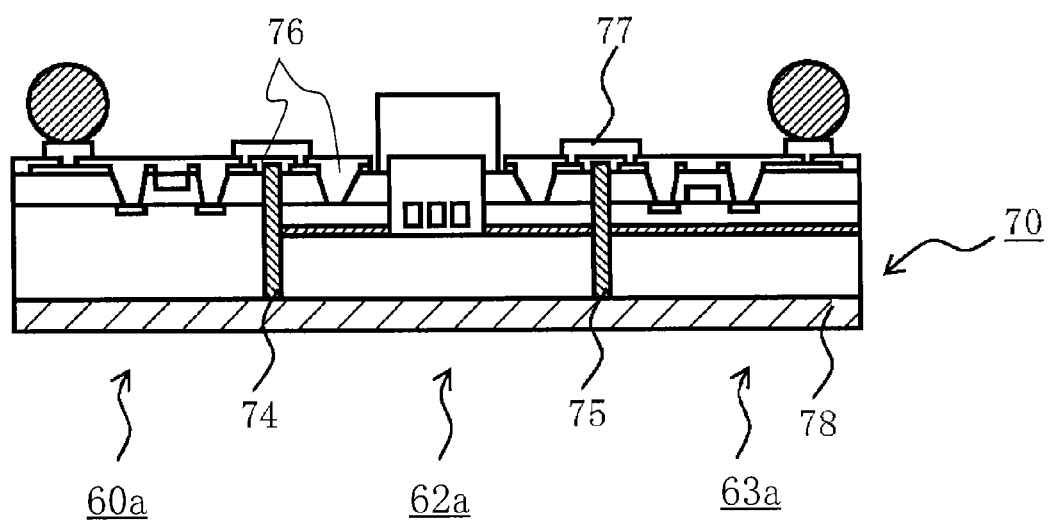
FIG. 7 is a cross-sectional view for illustrating the conventional technical problem.

FIG. 7 illustrates an example of a partial cross-sectional structure of a semiconductor integrated device formed as the reconfigured wafer 64. After different types of semiconductor chips 60a, 62a, and 63a are integrated in a reconfigured wafer 70 with resins 74, 75, and 78, an insulating layer 76 and a redistribution layer 77 are formed by using a semiconductor back-end process. Different from an available SiP, in this technology, it is not required to use the interposer substrate, and the different types of semiconductor chips may be interconnected by small line and space redistribution layer formed by a semiconductor back-end process, so that a high density integration which is not influenced by a design rule of the interposer substrate may be realized. Also, different from an available system on chip (SoC), the different types of semiconductor chips may easily be embedded on one chip. Therefore, it is possible to use an commercially available semiconductor chip for a novel system development, so that the development period may be shortened and eventually the development cost may be decreased.

However, there are some problems in this example. First, there is a problem that a step is generated on a surface of the reconfigured wafer due to deformation of a adhesion layer when the semiconductor chip is mounted on the adhesion layer as illustrated in FIGS. 8A to 8D.

Figure 8A:
FIGS. 8A-8D are cross-sectional views for illustrating the conventional technical problem.
Figure 8B:
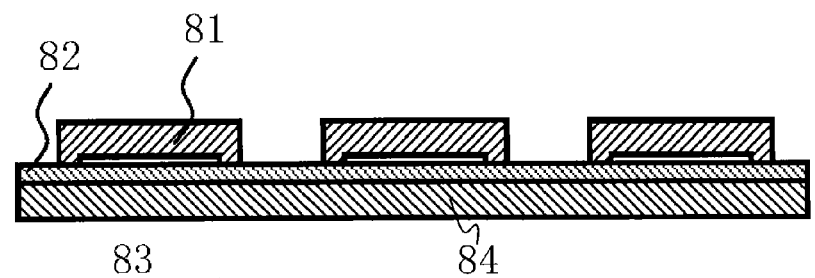
Figure 8C:
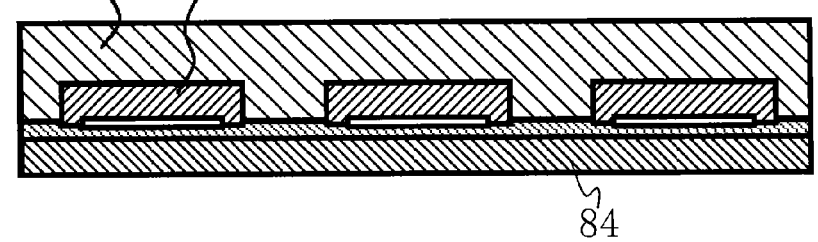
Figure 8D:
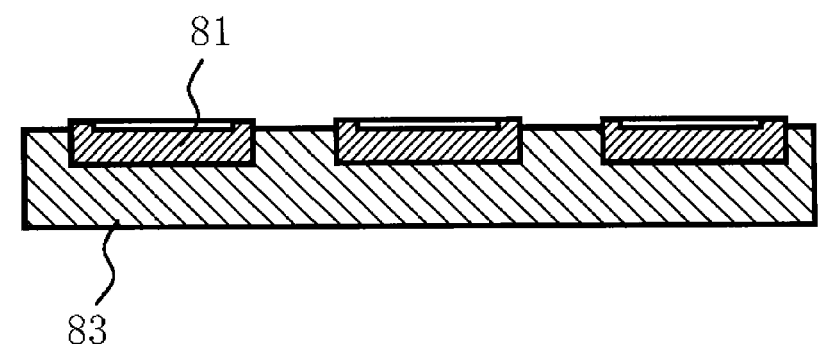

Specifically, as illustrated in FIGS. 8A to 8D, after a plurality of semiconductor chips 81 (FIG. 8A) are mounted on a surface of a supporting substrate 84 provided with a adhesive layer 82 (FIG. 8B), they are fixed with the resin 83 on surfaces thereof and a gap therebetween (FIG. 8C), then the supporting substrate 84 is removed to form the reconfigured wafer (FIG. 8D). Since the adhesion layer 82 has plasticity, there is a problem that the deformation is generated when the semiconductor chips 81 are placed and the step is generated on the surface of the reconfigured wafer. In this manner, asperity on the surface of the reconfigured wafer may cause disconnection on the step of the redistribution layer, which interconnects the different types of semiconductor chips.

Figure 9A:
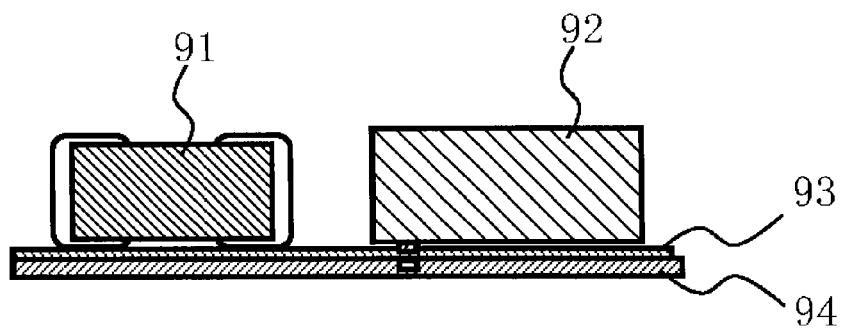
FIGS. 9A-9D are views for illustrating the conventional technical problem.
Figure 9B:
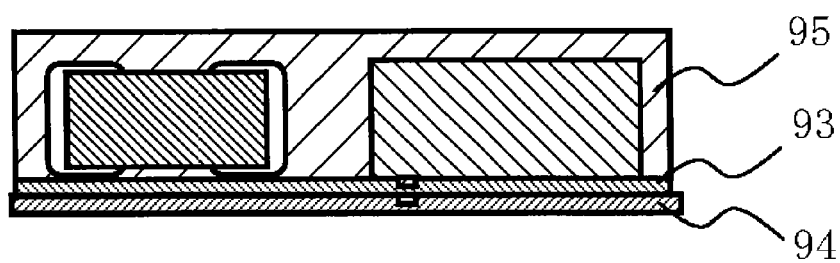
Figure 9C:
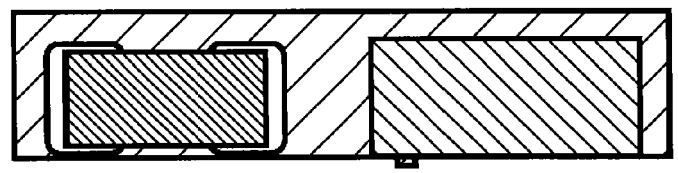
Figure 9D:
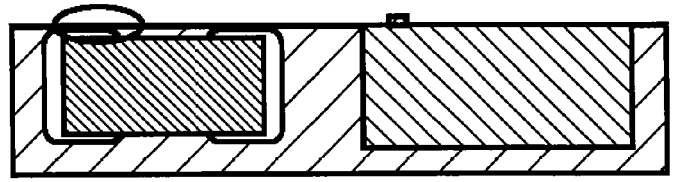

Further, in this example, in a case in which a semiconductor chip 92 and a passive component 91 are mixedly mounted to form reconfigured wafer as illustrated in FIGS. 9A to 9D, there may occur problems described below. One problem is that a resin 95 may penetrates between electrodes of the passive component 91, so that a surface of the electrode of the passive component 91 is buried in the resin 95. Another problem is the resin 95 arranged between the electrodes of the passive component 91 is peeled. FIGS. 9A to 9D are cross-sectional views of steps of manufacturing the reconfigured wafer, and as illustrated in FIG. 9A, after a adhesion layer 93 is formed on a substrate 94, a semiconductor chip 91 and a passive components 92 are mounted on a surface thereof. Next, after a resin 95 is encapsulated around them (FIG. 9B), the substrate 94 and the adhesion layer 93 are removed (FIG. 9C). Thereafter, when the formed reconfigured wafer is vertically reversed and the surface thereof is inspected, there is a case in which, depending on a shape of the electrode of the passive component 91, an electrode (terminal unit) thereof is buried in the resin 95, and the resin 95, which should coat the passive component 91, is peeled. This makes electric interconnection to the passive component 91 by a redistribution layer formed on an upper surface of the passive component 91 difficult. This is considered to be because bonding force of adhesion layer 93 to fix the passive component 91 is weaker than that of the semiconductor chip 92. Because only a part of the component 91 is in contact with the adhesion layer 93 due to the asperity on the surface in the vicinity of the electrode of the passive component 91. Therefore, there are conflicting technical problems that, although it is possible to prevent the peeling and the burying of the passive component 91 by increasing bonding strength of the adhesion layer 93, the resin 95 on the surface of the passive component may partially ripped off by the strengthened adhesion layer 93 during removal of the substrate 94 and this causes the step on the surface of the reconfigured wafer.

The step on the surface of the reconfigured wafer generated by the ripping off of the resin 95 may cause occurrence of pattern defect at a photolithography step of the insulating layer and the redistribution layer on the wafer. This leads to interconnection problem between the semiconductor chip 92 and the passive component 91.

As a similar problem, there is a case in which the asperity on the surface of the reconfigured wafer is generated by peeling and burring on the surface of the different types of chips. The peeling and the burring is caused by the asperity due to a mounting process of the different types of chips on the adhesion layer and difference in chip shapes, and the asperity on the surface causes redistribution layer interconnection problem.

Figure 22:
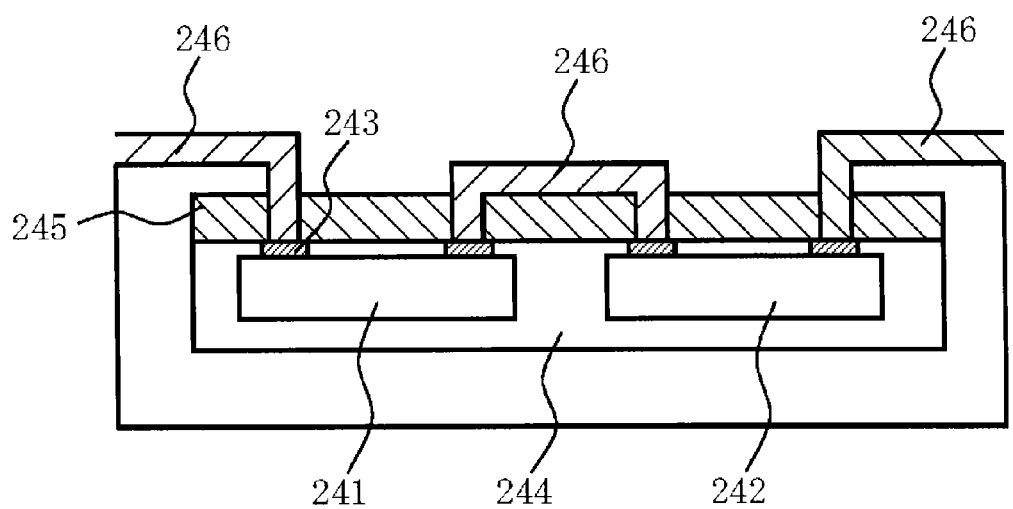
FIG. 22 is a cross-sectional view for illustrating a wiring structure of a second embodiment.

The second embodiment is achieved for solving the above-described problem. FIG. 22 is a schematic cross-sectional view for illustrating a wiring structure of a second embodiment. The semiconductor integrated device of this embodiment includes, as illustrated in FIG. 22, a semiconductor chip or a passive components 241, 242 having a plurality of electrode terminals, a ball electrode 243 formed on the electrode terminals (not illustrated) of the semiconductor chip or the passive component 241, 242. And, the device includes an insulating resin (first insulating portion) 244 formed on side surfaces of the semiconductor chip or the passive components 241, 242 and the electrodes 243 and a backside surface of the semiconductor chip or the passive component 241,242. And, the device includes an insulating layer 245 formed on the resin 244 and the ball electrodes 243. And via electrodes are formed on the ball electrodes 243 in the insulating layer 245, and a redistribution layer 246 are formed on the insulating layer (second insulating portion) 245 that interconnects the ball electrodes 243. In the semiconductor integrated device, upper surfaces of the ball electrodes 243 and the insulating resin 244 are located on a substantially same or identical plane.

Figure 23:
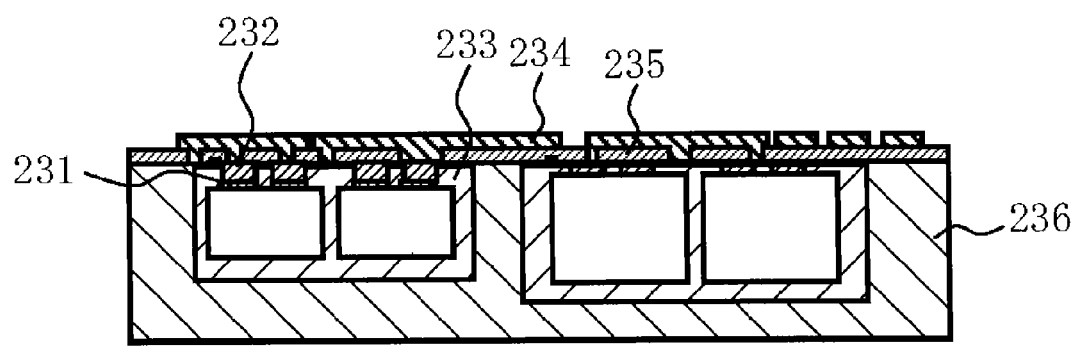
FIG. 23 is a cross-sectional view for illustrating a semiconductor integrated device of the second embodiment.

FIG. 23 illustrates an example of the structure of the semiconductor integrated device (integrated semiconductor package formed by integrating a plurality of semiconductor packages) after the redistribution layer 234 is formed. The semiconductor integrated device includes: a plurality of semiconductor chips, a first insulating portion covering the semiconductor chips, I/O electrode 231 formed on each of the semiconductor chips, a ball electrode (interconnection electrode unit) 232 formed on the I/O electrode 231, an insulating layer (second insulating portion) 235, a redistribution layer 234 formed on the second insulating portion 235. In the device, the first insulating portion is formed of a first resin portion 233 and a second resin portion 236. The first resin portion 233 coats the side surface and the backside surface of the electronic component and a side surface of a ball electrode 232, and a second resin portion 236 coats a side surface or the side surface and a backside surface of the first resin portion 233. In this embodiment, the asperity such as the step of the ball electrode 232 on a surface of the semiconductor package is planarized. Therefore, when this is mounted on the adhesion layer and a reconfigured wafer resin is formed by printing, a problem that a part of the semiconductor package is peeled or buried hardly occurs. Also, according to this embodiment, possibility that the asperity is present on the surface of the reconfigured wafer is low after the reconfigured wafer is obtained. Therefore, a problem that redistribution interconnection pattern defect occurs at the photolithography step of forming redistribution layer 234 on the reconfigured wafer is avoided.

Also, the method of manufacturing the semiconductor integrated device of this embodiment at least includes a step of forming the ball electrode on the electrode of a plurality of semiconductor packages or passive components, a step of mounting the packages or components on the adhesion layer formed on the supporting substrate such that the ball electrode of the semiconductor package or the passive component is arranged on upper side, a step of forming the resin layer on the semiconductor package or the passive component, a step of mechanically grinding the resin layer to expose a part of the ball electrode, a step of removing the supporting substrate and the adhesion layer, and a step of dividing the resin layer of a semiconductor package to form a block of the semiconductor package or the passive component.

Also, a method of manufacturing a semiconductor integrated device according to another embodiment includes a step of forming a ball electrode on an electrode of a plurality of semiconductor packages or passive components, a step of mounting the semiconductor packages or the passive components on a adhesion layer, a step of forming a resin layer on the semiconductor package or the passive component, a step of mechanically grinding the resin layer to expose a part of the ball electrode, a step of removing the adhesion layer together with a supporting substrate, a step of dividing the resin layer of the semiconductor package or the passive component to form a block of the semiconductor package or the passive component, a step of mounting the block of the semiconductor package or the passive component on a second adhesion layer, a step of forming a second resin layer on the second adhesion layer of the block of the semiconductor package or the passive component, a step of forming an insulating layer on the block of the semiconductor package or the passive component, the second resin layer, and the ball electrode, and a step of forming a redistribution layer on the insulating layer.

A method of manufacturing a semiconductor integrated device according to still another embodiment includes a step of forming a ball electrode on an electrode of a plurality of semiconductor packages or passive components, a step of mounting the semiconductor package or the passive component on a adhesion layer formed on a supporting substrate such that the ball electrode is brought into contact with the adhesion layer, a step of forming a resin layer on the semiconductor package or the passive component, and a step of removing the adhesion layer together with the supporting substrate.

Second Example

Second example is described with reference to FIGS. 10A to 10G illustrating this example. FIGS. 10A to 10G are cross-sectional views illustrating steps of manufacturing a semiconductor integrated device. In this embodiment, a projection-shaped ball electrode 103 is formed on an electrode 102 of a semiconductor package 101 (FIG. 10A) (FIG. 10B). Next, the semiconductor package is mounted on a supporting substrate 105 with a adhesion layer 104 (FIG. 10C) and encapsulated with a resin 106 (FIG. 10D), thereafter, a surface is mechanically ground to expose the ball electrode 103 (FIG. 10E). In this manner, by providing the projection-shaped ball electrode 103 on the electrode 102 of the semiconductor package, it is possible to expose only the ball electrode 103 without mechanically grinding the semiconductor package and the electrode 102 by the mechanical grinding.

Next, after the semiconductor packages 101 are removed from the adhesion layer, they are separated by using dicing (FIG. 10F). According to this, the semiconductor package originally having a step on an electrode portion may become a resin-encapsulated block with flat surface. Further, it is possible to form a reconfigured wafer using the semiconductor packages with a resin layer 107 (FIG. 10G). Meanwhile, this example is illustrative only and this may be variously modified unless the essence thereof is not lost.

Third Example

FIGS. 11A to 11J are step cross-sectional views for illustrating a third example. A summary of this example is described with reference to FIGS. 11A to 11J. First, a bump electrode 113 for wiring interconnection is formed on an electrode 112 of each of a plurality of semiconductor chips 111. Although the bump electrode 113 may be thick metal and the bump electrode and a shape thereof is not especially limited, a projection shape, a column shape, or a spherical shape is preferred.

After the bump electrode 113 is formed, the semiconductor chip is mounted on a adhesion layer 114 (FIG. 11A), and a resin formed of an epoxy resin and the like is printed thereon to form a resin layer 115 (FIG. 11B). Thereafter, the adhesion layer 114 and the substrate 116 are removed (FIG. 11C). Next, an upper surface is planarized by mechanical grinding and the like to expose a bump electrode portion of the semiconductor chip (FIG. 11D). Meanwhile, at that time, filler formed of quartz and the like dispersed in the resin is partially exposed. Next, after thin metal is formed by using a semiconductor process to form an alignment mark 116 (FIG. 11E), a resin block 311 is formed by dicing (FIG. 11F).

Further, after the resin block 311 is mounted on a adhesion layer 114b (FIG. 11G), a second resin layer 117 is formed (FIG. 11H), thereafter, the adhesion layer 114b is removed to acquire a reconfigured wafer 312 (FIG. 11I). Thereafter, a planarizing layer (insulating layer) 119 and a redistribution layer 118 are formed as needed by using the semiconductor process (FIG. 11J). Meanwhile, metal such as Au, Al, Cu, and Ti may be used or a carbon nanotube may be used as a material of a redistribution layer 118. The material is not especially limited.

In the example, since a surface of the semiconductor chip is completely planarized in the resin block 311 by the mechanical grinding and the like, it is possible to effectively prevent component burring and component peeling due to asperity on the surface of the semiconductor chip. Further, since the surface of the resin block is sufficiently planarized, planarity of a planarizing layer (insulating layer) being a base layer of a redistribution layer is improved. Also, since the filler formed of quartz and the like dispersed in the resin is exposed by using this method, so that adhesion between the semiconductor chip and the planarizing layer is improved.

Also, by forming a columnar bump electrode 113, variation in exposed area of the electrode by a grinding amount becomes small when the surface of the resin block is mechanically ground. In this example, since the columnar electrode is formed, variation in size and shape of an electrode pattern by the mechanical grinding may be eliminated and accuracy of the pattern exposed on the surface may be improved.

Figure 12:
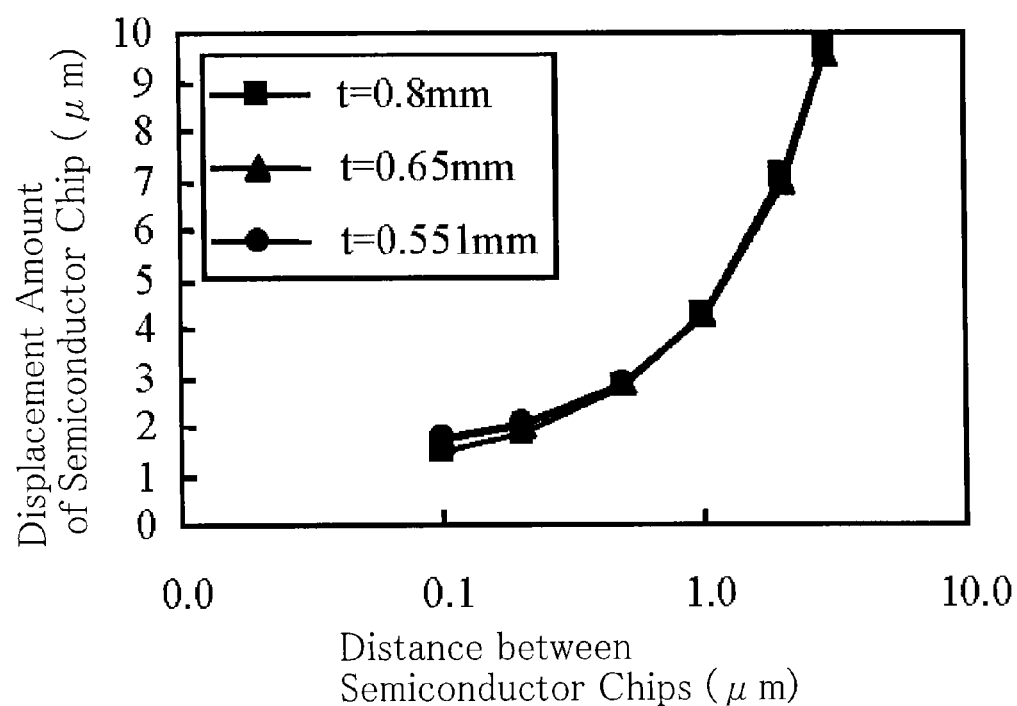
FIG. 12 is a graph illustrating a result of simulation of relationship between a distance between semiconductor chips and a displacement amount of semiconductor chip due to resin shrinkage.

Furthermore, since mounting accuracy may be improved due to the alignment mark, it becomes possible to decrease a distance between the semiconductor chips. FIG. 12 illustrates a result of simulation of a relationship between a gap (or distance) between the semiconductor chips and an amount of resin shrinkage (=displace amount of semiconductor chip) of this example. According to this, it is found that the amount of resin shrinkage does not largely depend on a resin thickness but largely depends on the distance between the semiconductor chips. It is found that misalignment of the semiconductor chip may be decreased to approximately 2 µm by decreasing the distance between the semiconductor chips to 100 µm. Therefore, by improvement of the alignment accuracy of the semiconductor chip, the distance between the semiconductor chips may be decreased, and variation in displacement of the semiconductor chip may be reduced, so that redistribution layer with small line and space can be achieved.

Further, a wiring interconnection failure rate in a temperature stress test is improved as compared to that of a device in which a bump electrode layer is not formed. This improvement is caused by a stress relaxation effect by arranging the bump electrode layer between the semiconductor chip and the redistribution layer. Especially, the effect is significant when metal such as Al, Au, Cu, Pb, and Sn is used as bump wiring.

Fourth Example

Figure 13A:
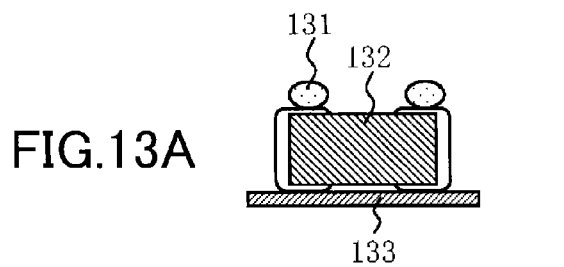
FIGS. 13A to 13H are step cross-sectional views for illustrating a fourth example.
Figure 13B:
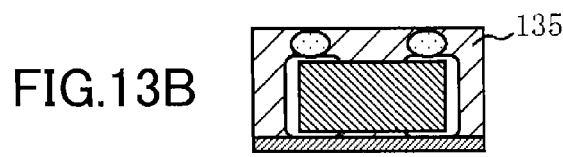
Figure 13C:
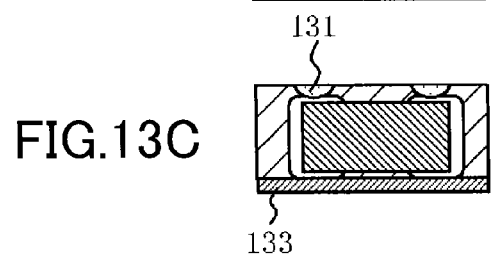
Figure 13D:
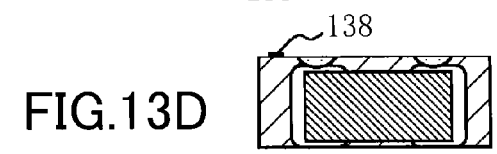
Figure 13E:
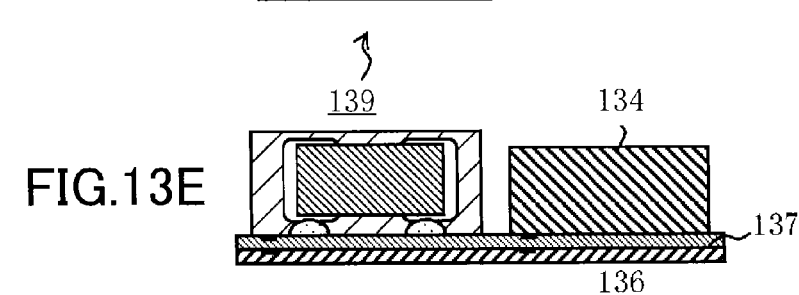
Figure 13F:
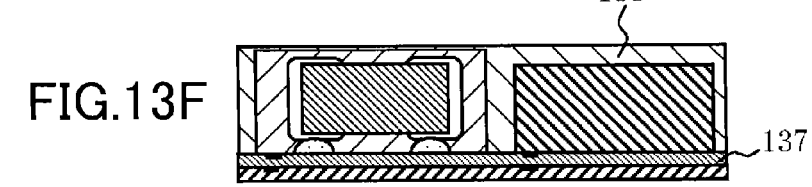
Figure 13G:
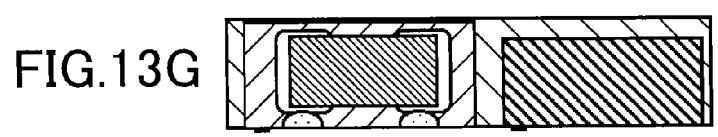
Figure 13H:
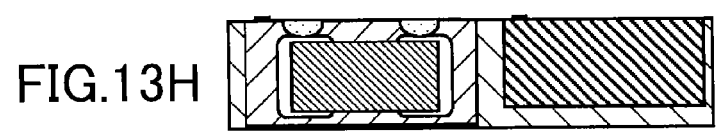

FIGS. 13A to 13H are step cross-sectional views for illustrating a fourth example. A summary of this example is illustrated in FIGS. 13A to 13H. In this example, after a passive component 132 is mounted on a adhesion layer 133, a bump electrode 131 is formed (FIG. 13A). The bump electrode 131 is formed by applying SnAgPb paste on an electrode of the passive component 132 and reflow the paste. Thereafter, the passive component 132 is resin-encapsulated with a first resin layer 135 (FIG. 13B) and the bump electrode 131 is exposed by further mechanically grinding (FIG. 13C). Thereafter, the adhesion layer 133 is removed and thin metal alignment mark 138 is formed by a semiconductor process as in the third example (FIG. 13D). Thereafter, a resin block 139 of the passive component 132 is obtained by dicing. Next, the resin block 139 is mounted on a adhesion layer 137 together with a semiconductor chip 134 (FIG. 13E) and a second resin layer 136 is formed (FIG. 13F), thereafter, the resin block 139 and the semiconductor chip 134 fixed by the second resin layer 136 is removed from the adhesion layer 137 to form reconfigured wafer (FIG. 13G). Meanwhile, since the adhesion layer 133 fixes the bump electrode 131 side of the passive component 132, a step on a surface of the reconfigured wafer does not increase as in a case in which an opposite side without the bump electrode 131 is fixed to the adhesion layer 133, even when the adhesion layer 133 having high strength is used. Because peeling of the second resin layer 136 rarely occur.

It is possible to form more planar surface of the resin block 139 by decreasing viscosity of the first resin layer 135. Low viscosity resin shows better step coverage on the resin block 139. To decrease a viscosity of the resin, an amount of quartz filler in the resin may be adjusted. It is possible to decrease the viscosity by decreasing the amount of quartz filler in the resin.

Also, according to this example, it is possible to integrate the resin block 139 with a high degree of positional accuracy by forming the alignment mark 138 on the resin block 139. Conventionally, alignment with the high degree of accuracy of approximately several μm and mounting could not be performed. Because a shape of component 132 sealed in the resin block 139 could not be observed when mounting it on the adhesion layer 137. However, in this example, it becomes possible to mount the components 132 with the high degree of positional accuracy by forming the alignment mark 138 on the resin block 139 by using the semiconductor process.

Figure 14:
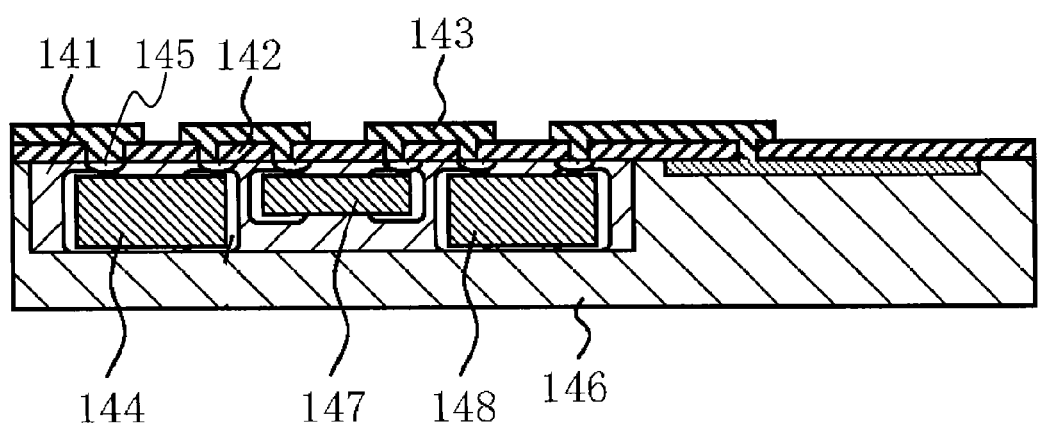
FIG. 14 is a cross-sectional view for illustrating the fourth example.

FIG. 14 illustrates a modified example of this example. In this example, resin blocks of passive components 144 and 148 and a semiconductor chip 147 are made with a first resin 141 and thereafter a reconfigured wafer of them is made with a second resin layer 146, then they are interconnected by a redistribution layer 143 formed on an insulating layer 142. Herein, a bump electrode 145 is formed on the passive components 144, 148. Since the passive components 144 and 148 generally have rounded shapes and large electrode asperity of not smaller than 10 μm, when the reconfigured wafer is formed with the second resin layer 146 without forming the first resin layer 141, the components 144, 148 may be buried in the second resin 146 and interconnection failure at the redistribution layer 143 could occur. However, since a surface of the first resin layer 141 is planarized in this example, it becomes possible to integrate the components 144 and 148 without burring them when the second resin is formed by printing.

Fifth Example

FIGS. 15A to 15G are step cross-sectional views for illustrating a fifth example. FIGS. 15A to 15G are cross-sectional views of steps of manufacturing resin blocks. In this example, an example of integrating two semiconductor packages 152 and two semiconductor chips 153 is illustrated.

In the semiconductor package 152, a soldered ball electrode 150 is formed as interconnection metal on a interconnection electrode. A cylindrical interconnection metal electrode layer 151 is formed on the semiconductor chip 153 (FIG. 15A). First, the packages 152 and chips 153 are mounted by using a chip bonder such that the soldered ball electrode 150 and a cylindrical interconnection metal electrode layer 151 are brought into contact with a adhesion layer 154 (FIG. 15B). Specifically, a adhesion layer composed of an acrylic adhesion layer 154 having a thickness of 10 μm and a PET base material 155 having a thickness of 100 μm is used. Next, a first resin layer 156 is formed by printing on the adhesion layer 154, the semiconductor packages 152, and the semiconductor chips 153 (FIG. 15C). The first resin layer 156 is obtained by dispersing 75 wt % of quartz filler particles having a diameter of 20 to 50 μm in an acid anhydride epoxy resin layer. After the first resin layer 156 is printed such that the semiconductor packages 152 and the semiconductor chips 153 are fully coated with attention not to form a void by using a vacuum printing equipment. After that, baking is performed at 100 degrees centigrade for two hours by using an oven. Thereafter, the semiconductor chips 152 and the semiconductor packages 153 are removed from the adhesion layer, and the baking is performed at 180 degrees centigrade for two hours by using the oven (FIG. 15D).

Next, the first resin layer is divided into the first resin layer composed of the semiconductor packages 152 and the first resin layer composed of the semiconductor chips 153 by dicing (FIG. 15E). The first resin layer 156 is ground by a mechanical grinding method to make them thin (FIG. 15F). The mechanical grinding method is performed by rotating #600 grinding stone at approximately 2000 rpm and pressing the same against a sample. According to this, upper surfaces of the soldered ball 150 of the semiconductor package 152 and the cylindrical interconnection metal electrode layer 151 of the semiconductor chip 153 were exposed. Meanwhile, since the ball electrode 150 of the semiconductor package 152 has a spherical shape, the grinding was stopped at substantially half the height of the ball such that an exposed area of the ball is the maximum. The mechanical grinding is also performed on a backside surface in order to planarize. Since a step on the backside surfaces of the semiconductor packages 152 and the semiconductor chips 153 is approximately 10 μm in this example, the mechanical grinding of approximately 15 μm was performed. After these processes, the resin block composed of the first resin layer 156 of the semiconductor packages 152 and that of the semiconductor chips 153 are further divided (FIG. 15G).

FIGS. 16A to 16F illustrate a modified example of this example. FIGS. 16A to 16F are step cross-sectional views illustrating steps of manufacturing a resin block. In this example, an example of integrating two semiconductor packages 152 and two passive components 153 is described.

Figure 16A:
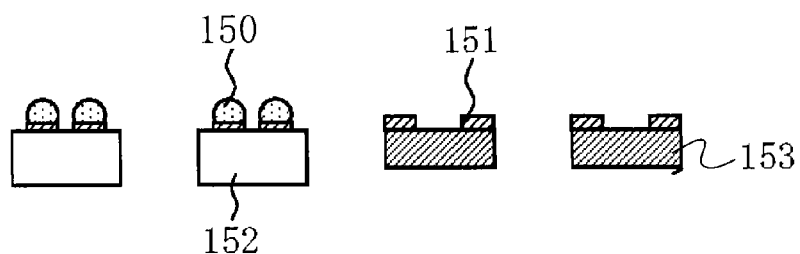
FIGS. 16A to 16F are cross-sectional views illustrating steps of manufacturing a resin block in the fifth example.
Figure 16B:
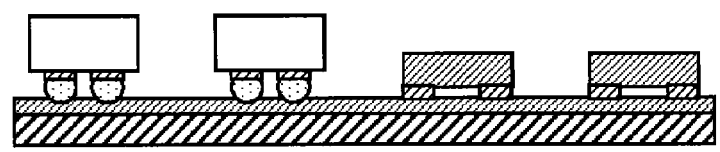

In the semiconductor package 152, a soldered ball 150 is formed as an electrode layer on an electrode, and in the passive component 153, only a metal electrode 151 is formed as a interconnection electrode layer (FIG. 16A). First, the semiconductor packages 152 and passive components 153 are mounted on a adhesion layer by using a flip chip bonder (FIG. 16B). Specifically, a adhesion layer composed of an acrylic adhesion layer having a thickness of 50 µm and a PET base material having a thickness of 100 µm is used. In this example, the adhesion layer having 180-degree peeling strength of 560 g/25 mm may be used.

Figure 16C:
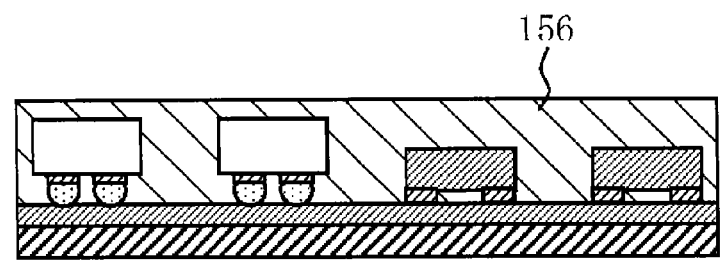
Figure 16D:
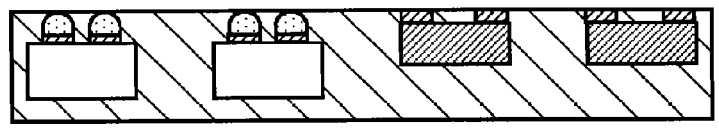

Next, a first resin layer 156 is formed by printing on the adhesion layer, the semiconductor packages 152, and the passive components 153 (FIG. 16C). The first resin layer 156 is obtained by dispersing 75 wt % of quartz filler particles having a diameter of 20 to 50 µm in an acid anhydride epoxy resin layer. The first resin layer 156 is printed such that the semiconductor packages 152 and the passive components 153 are fully coated with attention not to form a void by using a vacuum printing equipment. And baking is performed at 100 degrees centigrade for two hours by using an oven, and thereafter, the semiconductor packages 152 and the passive components 153 are removed from the adhesion layer and final baking is performed at 180 degrees centigrade for two hours by using the oven (FIG. 16D).

Figure 16E:
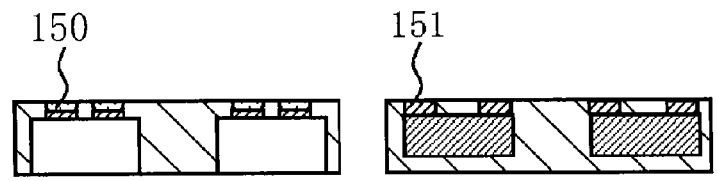
Figure 16F:
Figure 19A:
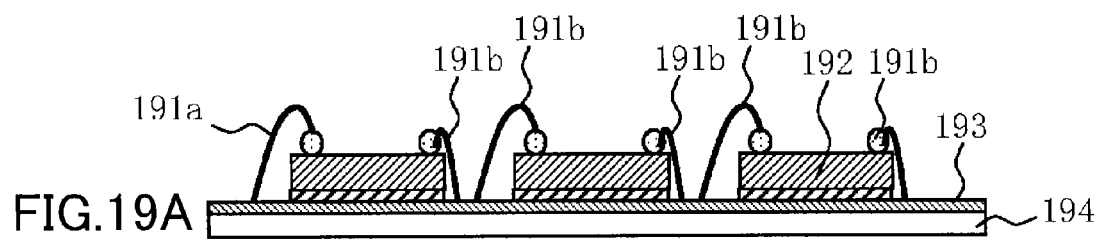
FIGS. 19A to 19D are step cross-sectional views for illustrating the sixth example.
Figure 19B:
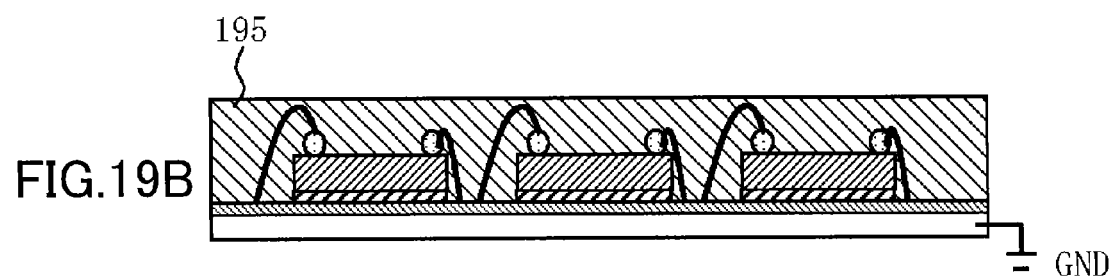
Figure 19C:
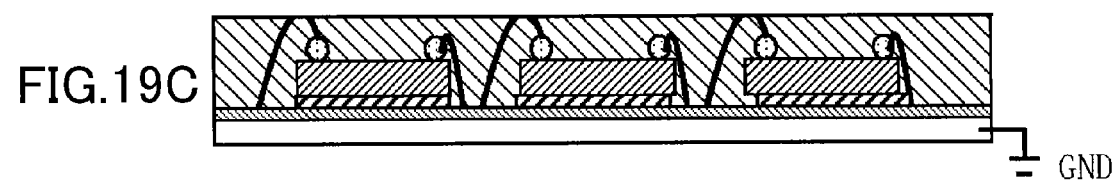
Figure 19D:

Next, the first resin layer 156 is divided into the first resin layer composed of the semiconductor packages 151 and the first resin layer composed of the passive components 153 by dicing. Thereafter, the soldered ball 150 and the metal electrode layer 151 are exposed by grinding the first resin layer 156 from a surface thereof by a mechanical grinding method (FIG. 16E). The mechanical grinding method is performed by rotating #600 grinding stone at approximately 2000 rpm and pressing the same against a sample. According to this, upper surfaces of the soldered ball 150 of the semiconductor package 152 and the electrode 151 of the passive component 153 are exposed. Since the ball electrode 150 of the semiconductor package 152 has a spherical shape, the grinding is stopped at substantially half the height of the ball such that an exposed area of the ball electrode 150 is the maximum. Also, a backside surface is mechanically ground in order to obtain planarity, and finally, the resin block composed of the first resin layer 156 of the semiconductor packages 152 and that of the passive components 153 are further divided (FIG. 16F).

Sixth Example

FIGS. 17A to 17F are step cross-sectional views for illustrating a sixth example. This example is described with reference to FIGS. 17A to 17F which are cross sectional views of manufacturing steps. In this example, a metal layer 174 is formed on a conductive substrate 175, and thereafter a semiconductor chips 171 are mounted on a adhesion layer 172. Next, wire bonding is performed by a ball bonding method on an electrode of the semiconductor chips 171 (FIG. 17A). A bonding wire 173 interconnects a pad electrode on the semiconductor chip 171 and the metal layer 174. Next, a resin formed of an epoxy resin is vacuum printed thereon to form a first resin layer 176 (FIG. 17B). Mechanical grinding is performed from an upper surface thereof to expose the bonding wires 173 (FIG. 17C). Meanwhile, although the bonding wires 173 are formed of Au in this example, a material is not limited and any other metal material such as Al and Cu may be used, and it is also possible to use a CNT (carbon nanotube), for example. After mechanical grinding was performed until a length of the bonding wire 173 from the pad electrode of the semiconductor chip 171 becomes approximately 30 to 100 µm, separated semiconductor packages are obtained by dicing (FIG. 17D). The bonding wire 173 is substantially perpendicular to the pad electrode in the vicinity of the electrode, so that a positional coordinate of an exposed portion of the bonding wire 173 substantially conforms to the positional coordinate of the pad electrode by grinding to a position close to the pad electrode. Therefore, when mounting the semiconductor packages on a specified position on the bonding layer 178, alignment of the packages are performed on the basis of the exposed portion of the bonding wire 173. After the mounting, a second resin layer 177 are formed by printing (FIG. 17E). By removing the adhesion layer 178, a reconfigured wafer is formed (FIG. 17F). Further, a surface of the reconfigured wafer is mechanically ground to be planarized as needed. Meanwhile, it is possible to effectively prevent electrostatic breakdown of the semiconductor chip 171 during grinding operation by interconnecting the metal layer 175 to ground potential.

Further, a modified example of this example is described with reference to FIGS. 18A to 18D, which are cross-sectional views of manufacturing steps. Although this example is substantially the same as that in FIGS. 17A to 17F, this is different in that there are two bonding wires to interconnect a metal substrate layer and an electrode of a semiconductor chip, which are a bonding wire 181 and a bonding wire 182, for each electrode. The bonding wire 182 is located above the bonding wire 181. In this state, after resin-encapsulation, mechanical grinding is performed such that the bonding wire 182 is exposed and the bonding wire 181 is not ground. According to this, the electrode is electrically interconnected to a metal substrate 184 by the bonding wire 181 even when the bonding wire 182 is ground, so that it is confirmed that an effect of preventing the electrostatic breakdown of the semiconductor chip confirmed by interconnecting the metal layer to the GND potential in the example in FIGS. 17A to 17F is further improved. Although there conventionally is a case in which the electrostatic breakdown occurs by disconnection of the electrode from a GND (grounding electrode) due to grinding of the bonding wire, since the electrode is always interconnected to the GND in this example, the effect of further preventing the electrostatic breakdown is confirmed. Meanwhile, since the bonding wire 181 is disconnected from the metal substrate 184 at the time of division by dicing, the bonding wire 181 may be used as a pad electrode of the semiconductor chip.

Still another modified example of this example is illustrated in FIGS. 19A to 19D. Although this example is substantially the same as those in FIGS. 17A to 17F and 18A to 18F, this is different in that there is one bonding wire 191 interconnected to a pad electrode of a semiconductor chip 192 for one electrode and that, a bonding wire 191a is interconnected to the electrode other than a GND electrode of the semiconductor chip 192 and a bonding wire 191b is interconnected to the GND electrode of the semiconductor chip 192. According to this, the bonding wire 191a located above is ground to expose interconnection metal and the bonding wire 191b is put in a state of being interconnected to the metal layer interconnected to GND potential. Further, it is configured such that the metal layer 193 and the bonding wire 191b are not disconnected from each other also at a dicing step. According to this, a backside surface of the semiconductor chip is always interconnected to the GND potential electrode of the semiconductor chip 192. Next, they are resin-encapsulated with a second resin layer to be made a reconfigured wafer, and thereafter, a planarizing layer and a redistribution layer are formed. Further, a backside surface of the reconfigured wafer is ground to expose a metal layer 193, and the exposed metal layer 193 works as a GND potential pad electrode to form a GND electrode through a bump electrode. According to this, GND electrode interconnection to the backside surface becomes possible without forming a via electrode to penetrate through the resin from an upper portion of the reconfigured wafer.

Seventh Example

Figure 20A:
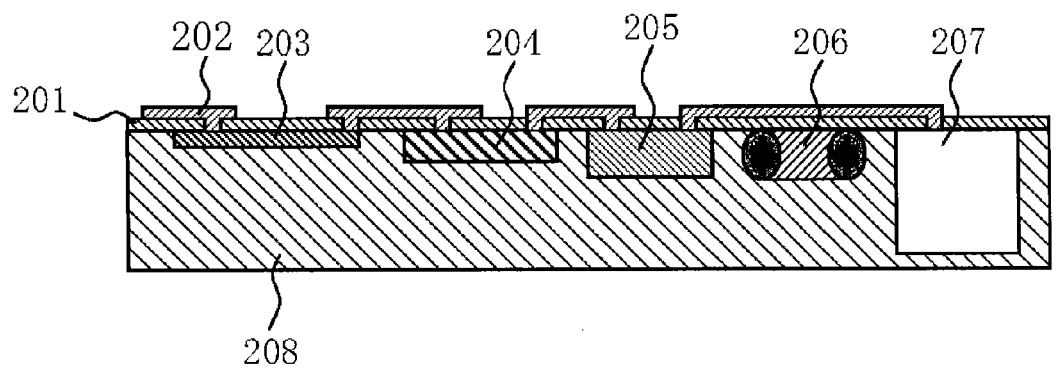
FIGS. 20A and 20B are views for illustrating a seventh example.
Figure 20B:
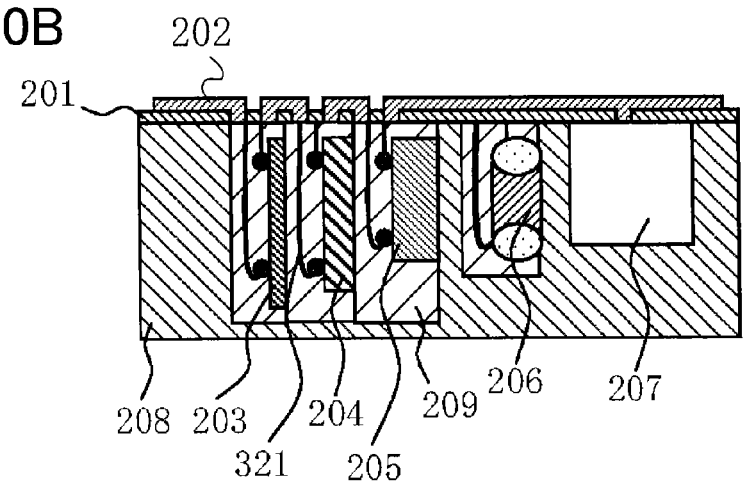
Figure 21A:
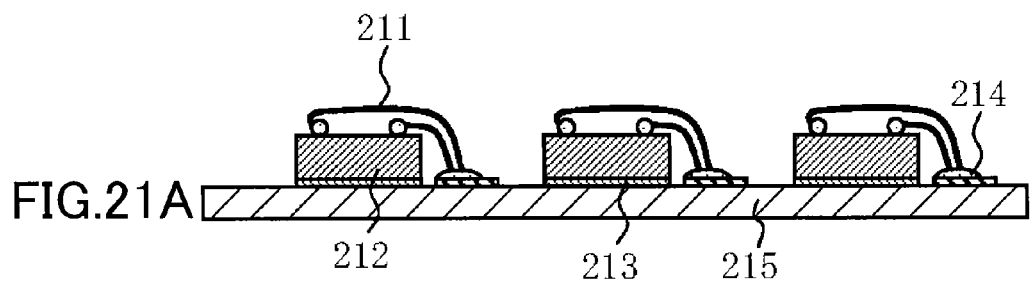
FIGS. 21A to 21I are step cross-sectional views for illustrating the seventh example.
Figure 21B:
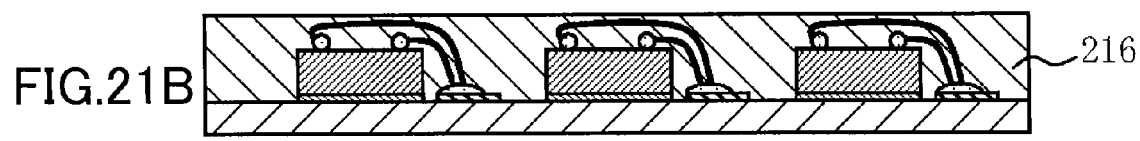
Figure 21C:
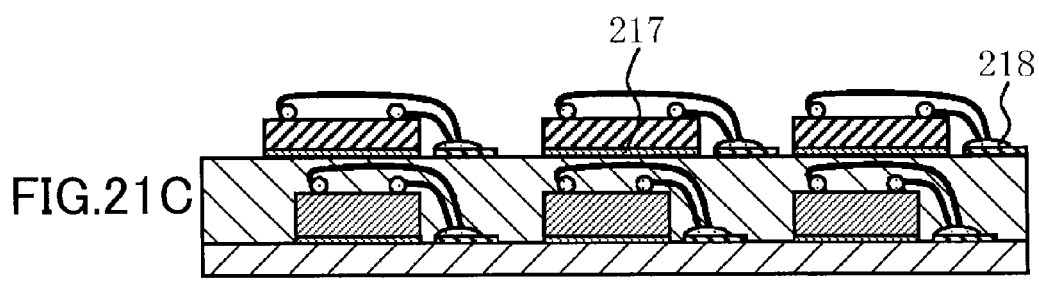
Figure 21D:
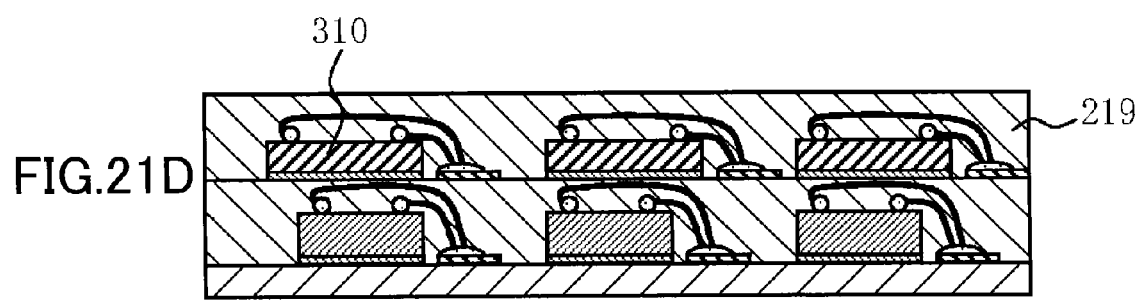
Figure 21E:
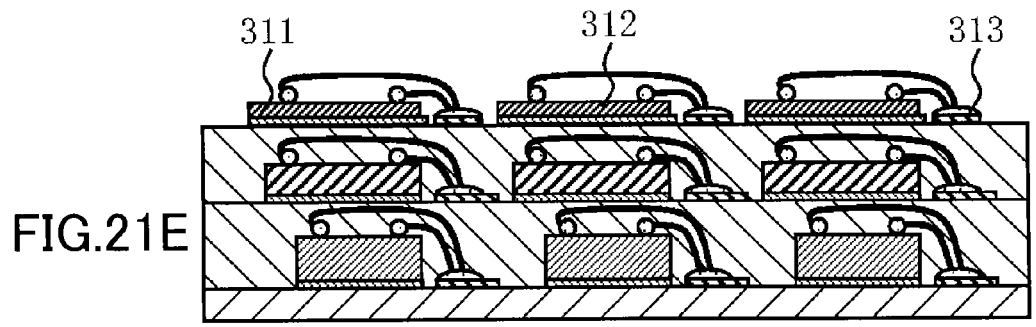
Figure 21F:
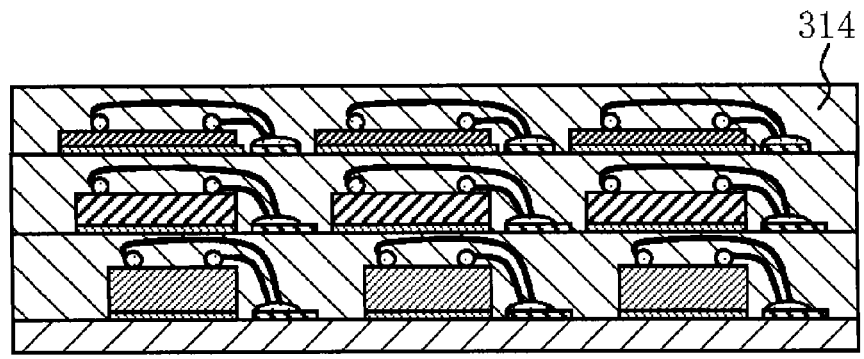
Figure 21G:
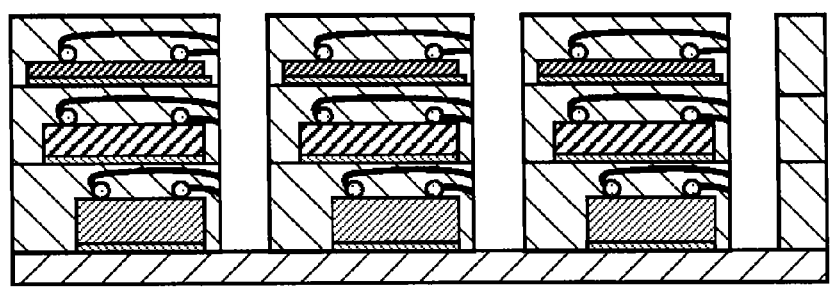
Figure 21H:
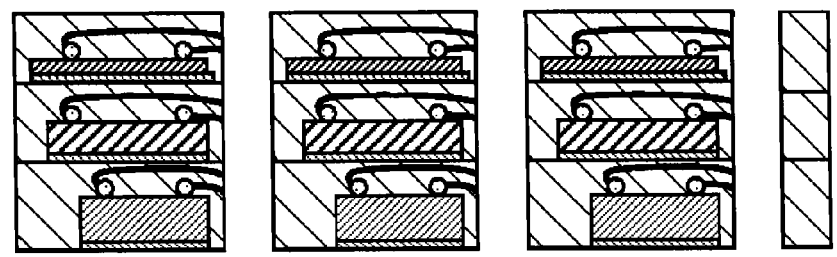
Figure 21I:
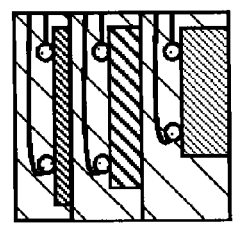

This example is illustrated in FIGS. 20A and 20B. FIG. 20A is a semiconductor integrated device for comparison of this example. And in this semiconductor integrated device, five devices, which are a semiconductor chip 203, a semiconductor chip 204, a semiconductor chip 205, a passive component 206, and a passive component 207, are resin-encapsulated with a second resin 208 are integrated to form a reconfigured wafer, and an insulating layer 201 and a redistribution layer 202 are further formed thereon. However, thicknesses of the semiconductor chips and the passive components are different from one another. Especially, a second resin layer 208 under a thin semiconductor chip becomes thick. When backside surface grinding is performed as before, since breaking the thickest passive component by the grinding has become concern, it is not possible to obtain a thin semiconductor integrated device. Therefore, the semiconductor integrated device has a problem that integration density is decreased and that a warpage amount of the reconfigured wafer is increased by a large amount of resin shrinkage due to a remaining thick resin.

FIG. 20B is a view illustrating this embodiment in which, although the passive component 207 has the same configuration as that of FIG. 20A, as for the semiconductor chip 203, the semiconductor chip 204, the semiconductor chip 205, and the passive component 206, which are thin, resin blocks obtained by encapsulating them with a first resin layer 209 after the bonding wire is formed are vertically arranged. In this example, the bonding wires are interconnected from a side surface of the resin block, and they are resin-encapsulated with a second resin layer 208 to be integrated again as the reconfigured wafer. It becomes possible to significantly improve the integration density in the resin and to decrease the warpage amount of the reconfigured wafer by configuring in this manner.

FIGS. 21A to 21I illustrate steps of forming the resin block for realizing the embodiment illustrated in FIG. 20B. First, a metal layer 214 is formed on a substrate. Next, a semiconductor chips 212 are bonded by a adhesion layer 212. Then bonding wires 21I are arranged in one direction to be interconnected to the metal layer 214. And thereafter, a first resin layer 216 is formed. Similarly, after a metal layer 218 is formed, semiconductor chips 310 are mounted on a adhesion layer 217. And, the bonding wires are arranged in one direction to be interconnected to the metal layer 218, then the first resin layer 219 is formed. Further, after the metal layer 313 is formed, the semiconductor chips 312 are mounted on the adhesion layer 311, the bonding wires are arranged in one direction to be interconnected to the metal layer, then the first resin layer 314 is formed. Thereafter, the components are separately divided by dicing and a supporting substrate is finally removed, thereby realizing a semiconductor chip blocks for the semiconductor integrated device illustrated in FIG. 20B.

According to this embodiment, it becomes possible to effectively inhibit peeling and burring in the reconfigured wafer and generation of asperity on a surface of the reconfigured wafer due to difference in shape of a semiconductor package, the semiconductor chip, or the passive component, which has been problems in conventional integration technology. Therefore, planarity of the surface may be improved and wiring interconnection failure of the reconfigured wafer caused by a step on underling insulating layer of the redistribution layer may be avoided.

A further preferable mode of this embodiment is hereinafter summarized.

An electrode formed on an electrode terminal of the semiconductor package, the semiconductor chip, or the passive component is preferably a spherical or columnar bump electrode.

It is preferable that a wire-shaped electrode (bonding wire) is formed on the bump electrode of the I/O electrode.

It is preferable that an alignment mark is arranged on a resin portion, which coats the side surface, and a backside surface of the semiconductor integrated device.

Third Embodiment

A method of manufacturing a semiconductor device according to this embodiment includes a step of preparing a plurality of resin-encapsulated semiconductor packages including a semiconductor chip, an I/O electrode (pad electrode) formed on the semiconductor chip, and a interconnection electrode unit formed on the I/O electrode, a step of forming an alignment mark corresponding to a pattern provided on the semiconductor package on a substrate, a step of arranging a plurality of semiconductor packages on the substrate by performing alignment by using the alignment mark and the pattern provided on the semiconductor package, and a step of dividing a plurality of semiconductor packages by a dicing process along a side surface of the semiconductor chip to obtain separate semiconductor chips.

This embodiment is another embodiment of the method of manufacturing the chip-scale package described in the first embodiment. According to this embodiment, a high degree of accuracy of arrangement of the semiconductor package before dicing is realized by using the alignment mark corresponding to the pattern provided on the semiconductor package. Therefore, it becomes possible to obtain smaller chip-scale package. The description of contents overlapped with those of the first embodiment is not repeated.

FIGS. 24A to 24G are step cross-sectional views illustrating the method of manufacturing the semiconductor device of this embodiment. First, a plurality of resin-encapsulated semiconductor packages 500, each of which includes a semiconductor chip 510, an I/O electrode (pad electrode) formed on the semiconductor chip 510, and a interconnection electrode unit 512 formed on the I/O electrode, are prepared.

The semiconductor chip 510 is electrically interconnected to a lead frame (terminal electrode) 516 by a bonding wire 514 formed of gold (Au) and the like. The semiconductor chip 510 and the bonding wire 514 are encapsulated with an encapsulating resin (encapsulating resin) 518.

Next, a substrate 520 formed of transparent glass or silicon, for example, is prepared. The substrate 520 has a wafer shape, for example. An alignment mark 522 corresponding to a pattern of the lead frame (terminal electrode) 516 provided on the semiconductor package 500 is formed on the substrate 520. A material of the alignment mark 522 is metal such as molybdenum (Mo) and titanium (Ti), for example.

Next, a plurality of semiconductor packages 500 are arranged on an adhesive layer 524 formed on the substrate 520 in a matrix pattern. A chip mounter or a flip chip bonder is used for arrangement, for example. It is also possible to use a bonding paste and the like in place of the adhesive layer 524 (FIGS. 24A and 24B). At that time, by matching the pattern of the lead frame (terminal electrode) 516 of the semiconductor package 500 relative to the alignment mark 522, alignment of the semiconductor package 500 to the substrate 520 is performed.

Next, an organic resin 526 is formed on the substrate 522 by using a printing method to form a resin wafer in which the semiconductor package 500 is encapsulated, for example (FIG. 24C). It is possible to use an epoxy resin as the organic resin 526, for example. Also, it is desirable to prevent inclusion of bubbles into the resin by using a vacuum printing method at the time of resin printing.

Next, a plurality of resin-encapsulated semiconductor packages 500 (resin wafer or reconfigured wafer) are removed from the adhesive layer 524 (FIG. 24D). Thereafter, a surface of the resin wafer is ground by a mechanical grinding method. Herein, it is ground until a ball electrode (bump) 512 being the interconnection electrode unit 512 of the semiconductor chip 510 or the bonding wire 514 is exposed (FIG. 24E).

It is desirable that the mechanical grinding is performed with #600 or finer grinding stone in view of securing a planar polished surface. Further, it is desirable to perform surface polishing by a polishing sheet including polishing liquid with alumina particles having a particle diameter of 1 jam, for example, to secure surface planarity and to realize a highly accurate pattern shape of an exposed portion of the ball electrode (bump) 512 or an exposed portion of the bonding wire 514.

Next, separated semiconductor chips 510 are obtained by the dicing process along the side surface of the semiconductor chip 510 (FIGS. 24F and 24G). The resin wafer on which a plurality of semiconductor packages 500 is integrated is divided by using a dicing apparatus to convert to chip-scale packages 600.

At that time, it is desirable to perform dicing near an edge of the chip based on positional information of the exposed bonding wire 514 or ball electrode (bump) 512, for example. According to this, it becomes possible to form an extremely small semiconductor chip-scale package 600 having a size closer to the size of the semiconductor chip 510.

As described above, according to the method of manufacturing the semiconductor device of this embodiment, it becomes possible to form the extremely small semiconductor chip-scale package from an existing or commercial semiconductor package by forming an alignment mark corresponding to the pattern provided on the semiconductor package and performing the alignment of a plurality of semiconductor packages by using the alignment mark and the pattern provided on the semiconductor package.

Fourth Embodiment

A method of manufacturing a semiconductor device of this embodiment is different from that of the third embodiment especially in that an interconnection electrode unit on a semiconductor chip is used as a pattern provided on a semiconductor package. A part of description of contents overlapped with those of the third embodiment is not repeated.

Figure 25A:
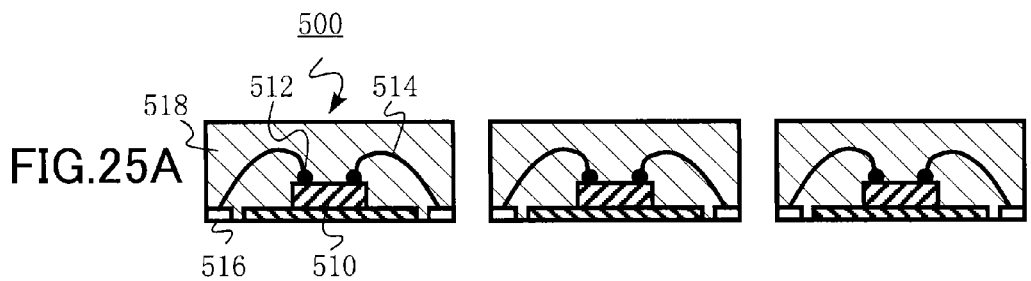
FIGS. 25A to 25G are step cross-sectional views illustrating a method of manufacturing a semiconductor device of a fourth embodiment.

FIGS. 25A to 25G are step cross-sectional views illustrating the method of manufacturing the semiconductor device of this embodiment. First, a plurality of resin-encapsulated semiconductor packages 500, each of which includes a semiconductor chip 510, an I/O electrode (pad electrode) formed on the semiconductor chip 510, and an interconnection electrode unit 512 formed on the I/O electrode, are prepared (FIG. 25A).

The semiconductor chip 510 is electrically interconnected to a lead frame (terminal electrode) 516 by a bonding wire 514 formed of gold (Au) and the like. The semiconductor chip 510 and the bonding wire 514 are encapsulated with an encapsulating resin (molding resin) 518.

Figure 25B:
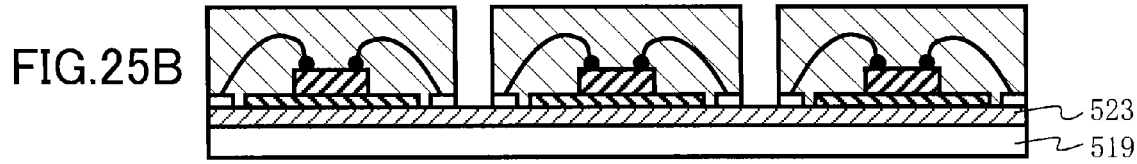

Next, a substrate 519 formed of transparent glass or silicon is prepared, for example. The substrate 519 has a wafer shape, for example. Next, a plurality of semiconductor packages 500 are arranged on an adhesive layer 523 formed on the substrate 519 (FIG. 25B). At that time, it is possible to seal a plurality of semiconductor packages 500 with an organic resin in order to improve mechanical strength.

Figure 25C:
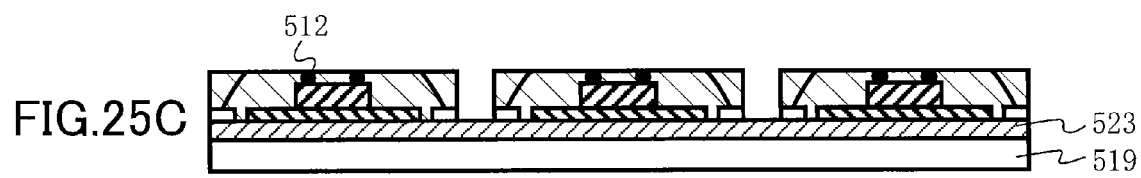

Next, a surface on a side of the I/O electrode of the semiconductor package 500 is ground by a mechanical grinding method. Herein, resin 518 is ground until a ball electrode (bump) 512 being the interconnection electrode unit 512 of the semiconductor chip 510 or the bonding wire 514 just above the ball electrode (bump electrode) 512 is exposed (FIG. 25C). At that time, the encapsulating resin 518 of the semiconductor chip 510 is left so as to coat a surface of the semiconductor chip 510.

It is desirable that the mechanical grinding is performed with #600 or finer grinding stone in view of securing a planar polished surface. Further, it is desirable to perform surface polishing by a polishing sheet including polishing liquid with alumina particles having a particle diameter of 1 µm, for example, to secure surface planarity and to realize a highly accurate pattern shape of an exposed portion of the ball electrode (bump) 512 or an exposed portion of the bonding wire 514.

Thereafter, the mechanically ground semiconductor packages 500 are removed from the adhesive layer 523 to be separated.

Next, a substrate 520 formed of transparent glass or silicon is prepared, for example. The substrate 520 has a wafer shape, for example. Then, an alignment mark 521 corresponding to arrangement of the interconnection electrode unit 512 provided on the semiconductor package 500 is formed on the substrate 520. A material of the alignment mark 521 is metal such as molybdenum (Mo) and titanium (Ti), for example.

Figure 25D:
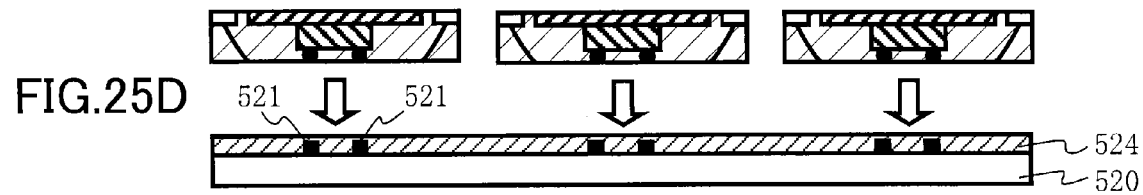
Figure 25E:
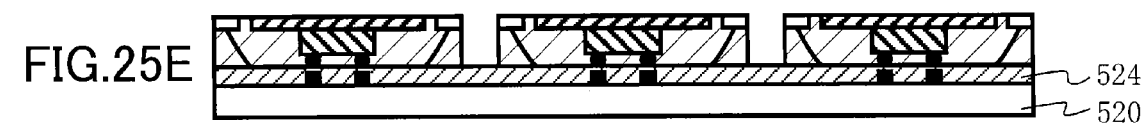

Next, a plurality of semiconductor packages 500, which are mechanically ground and separated, are arranged on an adhesive layer 524 formed on the substrate 520 in a matrix pattern (FIGS. 25D and 25E). A chip mounter or a flip chip bonder is used for arrangement, for example. It is also possible to use a bonding paste in place of the adhesive layer 524. At that time, by matching the pattern of the interconnection electrode unit 512 of the semiconductor package 500 to the alignment mark 521, alignment of the semiconductor package 500 relative to the substrate 520 is performed.

Meanwhile, when a transparent substrate is used as the substrate 520, it becomes possible to inspect misalignment between the pattern of the interconnection electrode unit 512 of the semiconductor package 500 and the alignment mark 521 by visible light from a backside surface of the substrate 520 after the semiconductor package 500 is arranged. Therefore, misalignment inspection after the arrangement becomes easy.

Figure 25F:
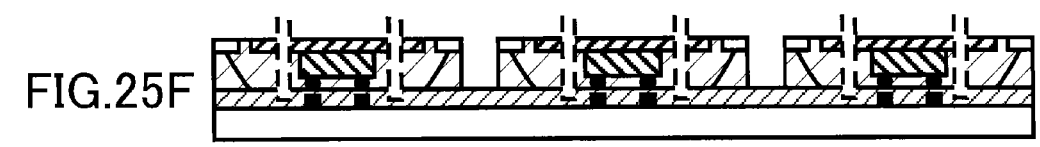
Figure 25G:

Next, separated semiconductor chips 510 are obtained by a dicing process along a side surface of the semiconductor chip 510 (FIGS. 25F and 25G). The wafer on which a plurality of semiconductor packages 500 is integrated is divided by using a dicing apparatus to convert to chip-scale packages 600.

At that time, it is desirable to perform dicing near an edge of the chip based on positional information of the exposed bonding wire 514 or ball electrode (bump) 512, for example. According to this, it becomes possible to form an extremely small semiconductor chip-scale package 600 having a size closer to the size of the semiconductor chip 510.

According to the method of manufacturing the semiconductor device of this embodiment, it becomes possible to form the extremely small semiconductor chip-scale package by forming the alignment mark corresponding to the pattern provided on the semiconductor package and performing the alignment of a plurality of semiconductor packages by using the alignment mark and the pattern provided on the semiconductor package.

Figure 26:
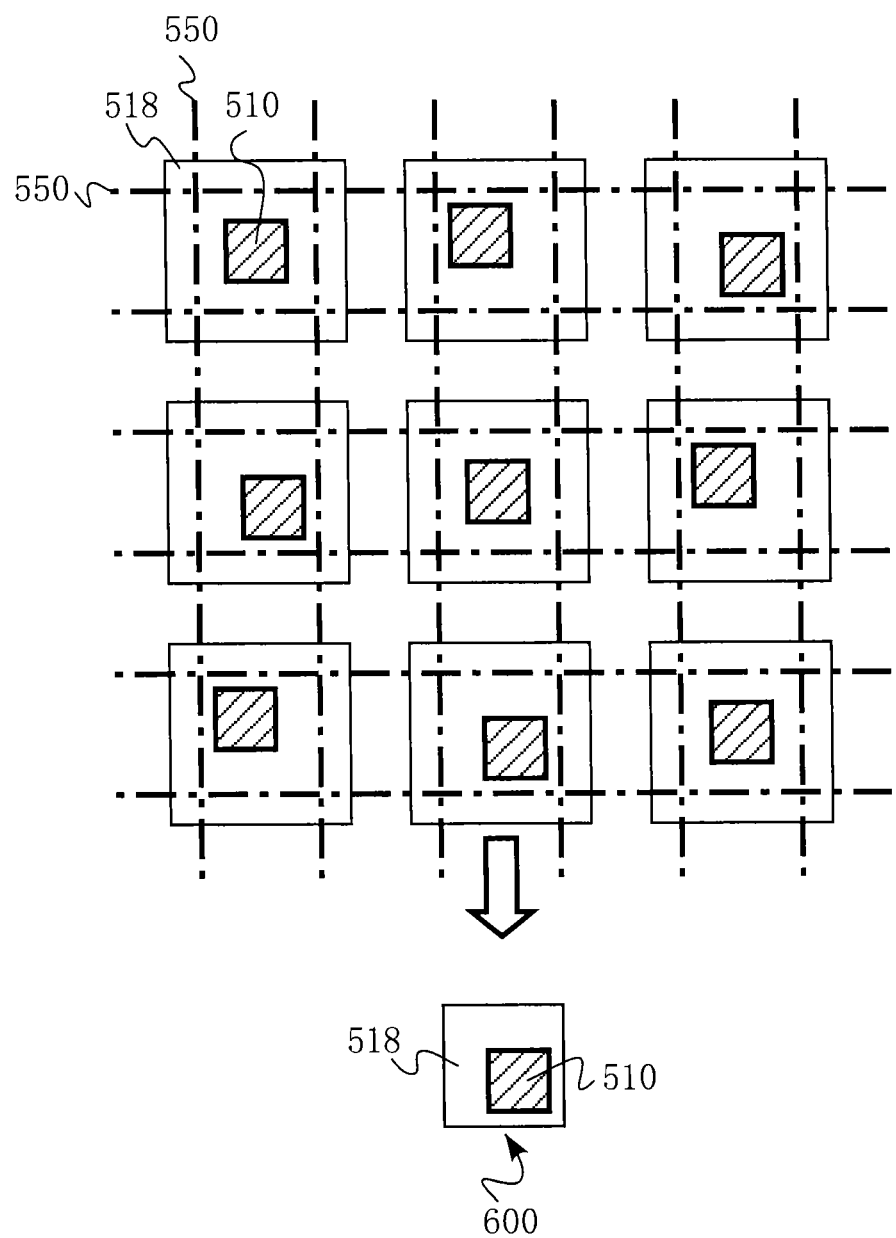
FIG. 26 is a view illustrating an effect of the method of manufacturing the semiconductor device of the fourth embodiment.
Figure 27:
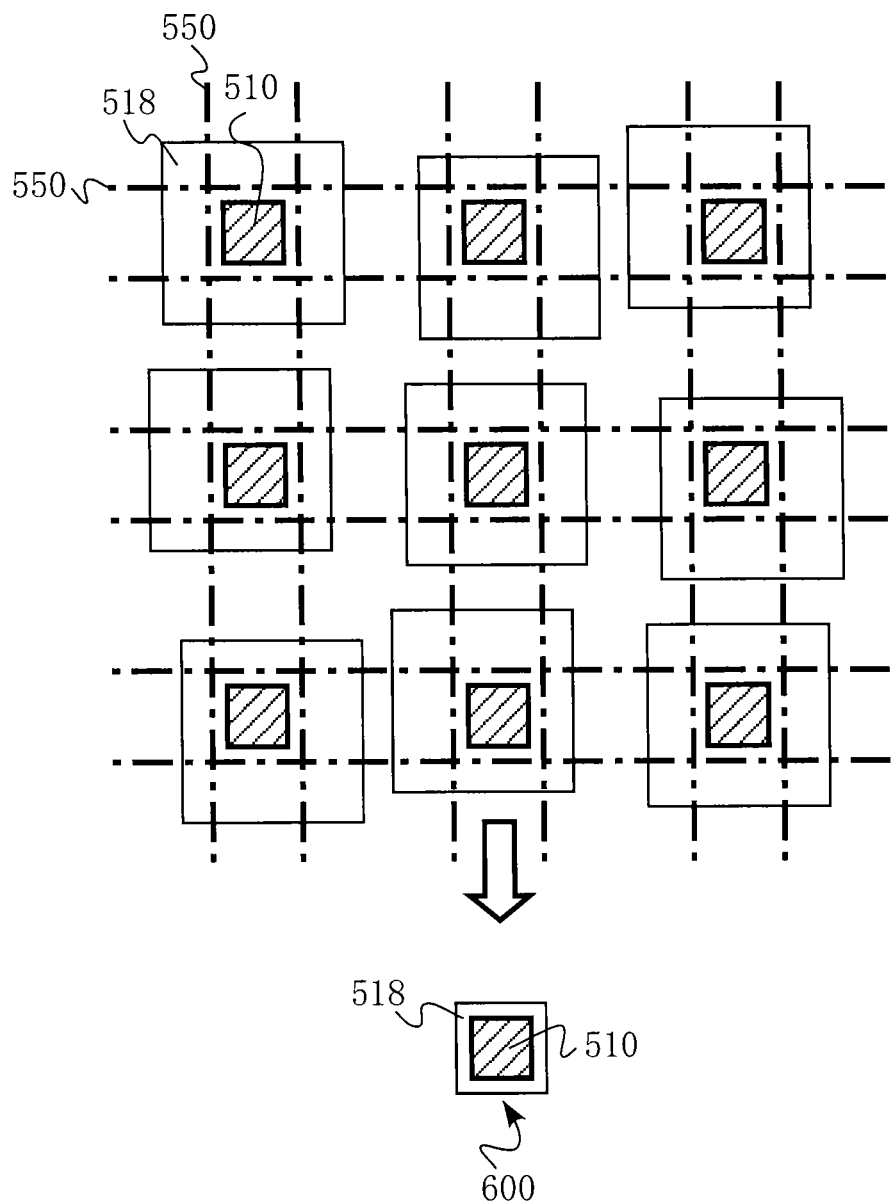
FIG. 27 is a view illustrating the effect of the method of manufacturing the semiconductor device of the fourth embodiment.

FIGS. 26 and 27 are views illustrating an effect of the method of manufacturing the semiconductor device of this embodiment. FIG. 26 illustrates a case of the third embodiment and FIG. 27 illustrates a case of this embodiment. They are top views at the time of dicing. A relationship of position and size of the encapsulating resin 518, the semiconductor chip 510, a dicing line 550 of the semiconductor package and the chip-scale package 600 is illustrated.

As shown in FIGS. 26 and 27, in this embodiment, the semiconductor packages are arranged on the substrate in a matrix pattern based on the positional information of the interconnection electrode unit on the semiconductor chip 510. Therefore, as compared to the third embodiment, relative positional accuracy on the substrate of the semiconductor chip 510 is improved even when the semiconductor chip 510 is misaligned relative to the encapsulating resin 518.

Therefore, it becomes possible to provide the dicing line in a position closer to the edge of the semiconductor chip 510 at the time of dicing. Therefore, the chip-scale package 600 much smaller than that of the third embodiment may be realized.

Meanwhile, in this embodiment, a case in which the semiconductor chip is mechanically ground and mechanically polished and thereafter arranged on the substrate is described. It is possible to easily perform the alignment and misalignment inspection by using the visible light by exposing the interconnection electrode unit by the mechanical grinding and the mechanical polishing. If it is possible to detect the interconnection electrode unit through the encapsulating resin by using infrared light and the like, for example, it is possible to perform the alignment with a high degree of accuracy without exposing the interconnection electrode unit by the mechanical grinding and the mechanical polishing.

While some embodiments of the present disclosure are described above, the embodiments are presented by way of example only and are not intended to limit the scope of the disclosure. Therefore, the embodiments may be carried out in various other modes and various omissions, substitutions, and changes may be made without departing from the spirit of the disclosure. That is to say, the embodiments and modifications thereof fall within the scope and spirit of the disclosure and also fall within the disclosure recited in claims and equivalents thereof.

While certain embodiments have been described, these embodiments have been presented by way of example only, and are not intended to limit the scope of the inventions. Indeed, a method of manufacturing semiconductor device, a semiconductor integrated device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor integrated device, comprising:
a plurality of electronic components, each of which including an I/O electrode;
an interconnection electrode unit formed on the I/O electrode of each of the electronic components;
a first insulating portion arranged on side surfaces of each of the electronic components, side surfaces of the interconnection electrode unit and a backside surface of each of the electronic components;
a second insulating portion formed on the first insulating portion and the interconnection electrode unit, the second insulating portion including a via on the interconnection electrode unit;
and a redistribution layer formed on the second insulating portion, the redistribution layer interconnected to the interconnection electrode unit,
wherein upper surfaces of the interconnection electrode unit and the first insulating portion are located on a substantially identical plane,
the redistribution layer electrically connects an interconnection electrode unit of at least one of the plurality of electronic components and an interconnection electrode unit of another one of the plurality of electronic components, and
the first insulating portion includes a first resin portion and a second resin portion, the first resin portion coats the side surfaces of each of the electronic components and the side surfaces of the interconnection electrode unit, and the second resin portion coats side surfaces or the side surfaces and a backside surface of the first resin portion.

2. The device according to claim 1, wherein the first resin portion coats the backside surface of each of the electronic components.

3. The device according to claim 1, wherein the interconnection electrode unit is a ball electrode.

4. The device according to claim 1, wherein at least one of the electronic components is a semiconductor chip.

5. The device according to claim 1, wherein at least one of the electronic components is a passive component.

* * * * *